(12) United States Patent
Saito

(10) Patent No.: US 9,455,123 B2
(45) Date of Patent: Sep. 27, 2016

(54) CURRENT REGULATION METHOD OF MULTIPLE BEAMS

(71) Applicant: NuFlare Technology, Inc., Yokohama (JP)

(72) Inventor: Kenichi Saito, Kanagawa (JP)

(73) Assignee: NuFlare Technology, Inc., Yokohama (JP)

(*) Notice: Subject to any disclaimer, the term of this patent is extended or adjusted under 35 U.S.C. 154(b) by 260 days.

(21) Appl. No.: 14/199,110

(22) Filed: Mar. 6, 2014

(65) Prior Publication Data

US 2014/0265827 A1 Sep. 18, 2014

(30) Foreign Application Priority Data

Mar. 13, 2013 (JP) ................. 2013-050927

(51) Int. Cl.
*H01J 3/14* (2006.01)
*H01J 37/317* (2006.01)
*H01J 37/06* (2006.01)
*H01J 37/304* (2006.01)

(52) U.S. Cl.
CPC ............ *H01J 37/3177* (2013.01); *H01J 37/06* (2013.01); *H01J 37/304* (2013.01); *H01J 2237/0653* (2013.01); *H01J 2237/06308* (2013.01); *H01J 2237/24535* (2013.01); *H01J 2237/24542* (2013.01); *H01J 2237/30477* (2013.01)

(58) Field of Classification Search
None
See application file for complete search history.

(56) References Cited

U.S. PATENT DOCUMENTS

| 5,633,507 | A  | * | 5/1997  | Pfeiffer ............... | B82Y 10/00 250/398 |
| 6,123,876 | A  | * | 9/2000  | Kobayashi ............ | H01J 1/316 252/512 |
| 6,270,389 | B1 | * | 8/2001  | Kobayashi ............ | H01J 1/316 445/21 |
| 6,617,587 | B2 | * | 9/2003  | Parker ................ | B82Y 10/00 250/396 R |
| 6,774,552 | B2 | * | 8/2004  | Chiba ................. | H01J 3/027 313/448 |
| 9,303,309 | B2 | * | 4/2016  | Helvajian ............ | C23C 14/22 |
| 2003/0085360 | A1 | * | 5/2003 | Parker .............. | B82Y 10/00 250/396 R |
| 2004/0119021 | A1 | * | 6/2004 | Parker .............. | B82Y 10/00 250/396 R |
| 2006/0289781 | A1 | * | 12/2006 | Tanimoto .......... | B82Y 10/00 250/396 R |

FOREIGN PATENT DOCUMENTS

| JP | 2006-261342 | 9/2006 |
| JP | 4676461 | 4/2011 |

* cited by examiner

*Primary Examiner* — Douglas W Owens
*Assistant Examiner* — Srinivas Sathiraju
(74) *Attorney, Agent, or Firm* — Oblon, McClelland, Maier & Neustadt, L.L.P.

(57) ABSTRACT

A current regulation method of multiple beams includes acquiring a current density distribution; selecting at least one beam whose current density is equal to or more than a threshold; measuring a current value of the at least one beam respectively by varying a voltage applied to the Wehnelt electrode and acquiring a correlation between the voltage and the current value; moving a stage to a position where the at least one beam is allowed to enter a current detector each time writing of a stripe region is completed; measuring, after moving the stage, a current value of the at least one beam while beams of the multiple beams whose current density is less than the threshold are blocked; operating a target voltage value applied to the Wehnelt electrode to cause the current value measured to be a target current value; and applying the target voltage value to the Wehnelt electrode.

13 Claims, 20 Drawing Sheets

FIG. 14B Current Density Distribution on Mask Surface

CURRENT REGULATION METHOD OF MULTIPLE BEAMS

CROSS-REFERENCE TO RELATED APPLICATION

This application is based upon and claims the benefit of priority from prior Japanese Patent Application No. 2013-050927 filed on Mar. 13, 2013 in Japan, the entire contents of which are incorporated herein by reference.

BACKGROUND OF THE INVENTION

1. Field of the Invention

Embodiments described herein relate generally to a current regulation method of multiple beams and, for example, relate to a technique of regulating a current when a pattern is written by irradiating a target object on a stage with multiple beams.

2. Related Art

A lithography technology taking charge of advancing micropatterning of semiconductor devices is an extremely important process that, among semiconductor manufacturing processes, solely generates a pattern. With ever higher integration of LSI in recent years, circuit line widths demanded for semiconductor devices become finer year by year. Here, the electron beam writing technology has essentially excellent resolving power and writing on a wafer is performed by using an electron beam.

For example, a writing apparatus using multiple beams is available. Since irradiation of many beams can be performed at a time by using multiple beams, when compared with a case of writing with one electron beam, throughput can significantly be improved. In such a writing apparatus of the multiple beams mode, for example, multiple beams is formed by passing an electron beam emitted from an electron gun assembly through a mask having a plurality of holes and each is blanking controlled and a desired position on a target object is irradiated with each beam that is not blocked (see Published Unexamined Japanese Patent Application No. 2006-261342, for example).

In an electron gun assembly of thermionic emission type used for electron beam writing, a cathode material evaporates during operation. Thus, the shape of the cathode material changes with time and under the influence thereof, the current density distribution of an electron beam with which a target object is irradiated also changes with time. Therefore, the amount of current of each beam of multiple beams changes with time. The amount of current of each beam is conventionally measured before writing and the irradiation time (exposure time) of each beam is determined based on the measured amount of current. However, as described above, if the writing time becomes longer with degradation of the cathode material by the passage of time, an error arises in the exposure time of each beam. Therefore, there has been a problem of deteriorating dimensional accuracy of a written pattern.

In electron beam writing of the single beam mode, though not multiple beams, a technology of regulating a bias voltage or the like so as to maintain a current density by measuring the amount of current of the whole single beam reaching a target object to acquire the current density is disclosed (see Japanese Patent No. 4676461, for example).

BRIEF SUMMARY OF THE INVENTION

In accordance with one aspect of the present invention, a current regulation method of multiple beams includes:

acquiring a current density distribution of multiple beams formed by letting portions of an electron beam emitted from a thermal-electron gun assembly having a Wehnelt electrode respectively pass through a corresponding opening of a plurality of openings;

selecting at least one beam whose current density is equal to or more than a threshold from the multiple beams by referring to the current density distribution;

measuring a current value of the at least one beam whose current density is equal to or more than the threshold respectively by varying a voltage applied to the Wehnelt electrode of the thermal-electron gun assembly and acquiring a correlation between the voltage applied to the Wehnelt electrode and the current value of the at least one beam;

moving a stage to a position where the at least one beam is allowed to enter a current detector arranged on the stage each time writing of a stripe region obtained by virtually dividing a writing region of a target object in a thin rectangular shape is completed while a pattern is being written on the target object arranged on the stage;

measuring, after moving the stage, a current value of the at least one beam each time the writing of the stripe region is completed by allowing the at least one beam to enter the current detector while beams of the multiple beams whose current density is less than the threshold are blocked;

operating a target voltage value applied to the Wehnelt electrode to cause the current value measured to be a target current value by using the correlation; and applying the target voltage value to the Wehnelt electrode.

In accordance with another one aspect of the present invention, a current regulation method of multiple beams includes:

acquiring a current density distribution of the multiple beams formed by letting portions of an electron beam emitted from a thermal-electron gun assembly having a Wehnelt electrode respectively pass through a corresponding opening of a plurality of openings;

selecting at least one beam whose current density is equal to or more than a threshold from the multiple beams by referring to the current density distribution;

measuring a current value of the at least one beam whose current density is equal to or more than a threshold while beams of the multiple beams whose current density is less than the threshold are blocked;

operating a target voltage value applied to the Wehnelt electrode to cause the current value measured to be a target current value by using a correlation between a voltage applied to the Wehnelt electrode of the thermal-electron gun assembly and the current value of the at least one beam; and applying the target voltage value to the Wehnelt electrode.

BRIEF DESCRIPTION OF THE DRAWINGS

FIGS. 14A and 14B are diagrams illustrating changes of a current density distribution accompanying evaporation of a cathode in Comparative Example of Embodiment 1;

DETAILED DESCRIPTION OF THE INVENTION

In the embodiments described below, a writing apparatus capable of suppressing changes of the current density distribution accompanying the passage of time when multiple beams writing is performed will be described.

In the embodiments described below, a configuration using an electron beam will be described as an example of a charged particle beam. However, the charged particle beam is not limited to the electron beam and a beam using charged particles such as an ion beam may also be used.

Embodiment 1

Figure 1:
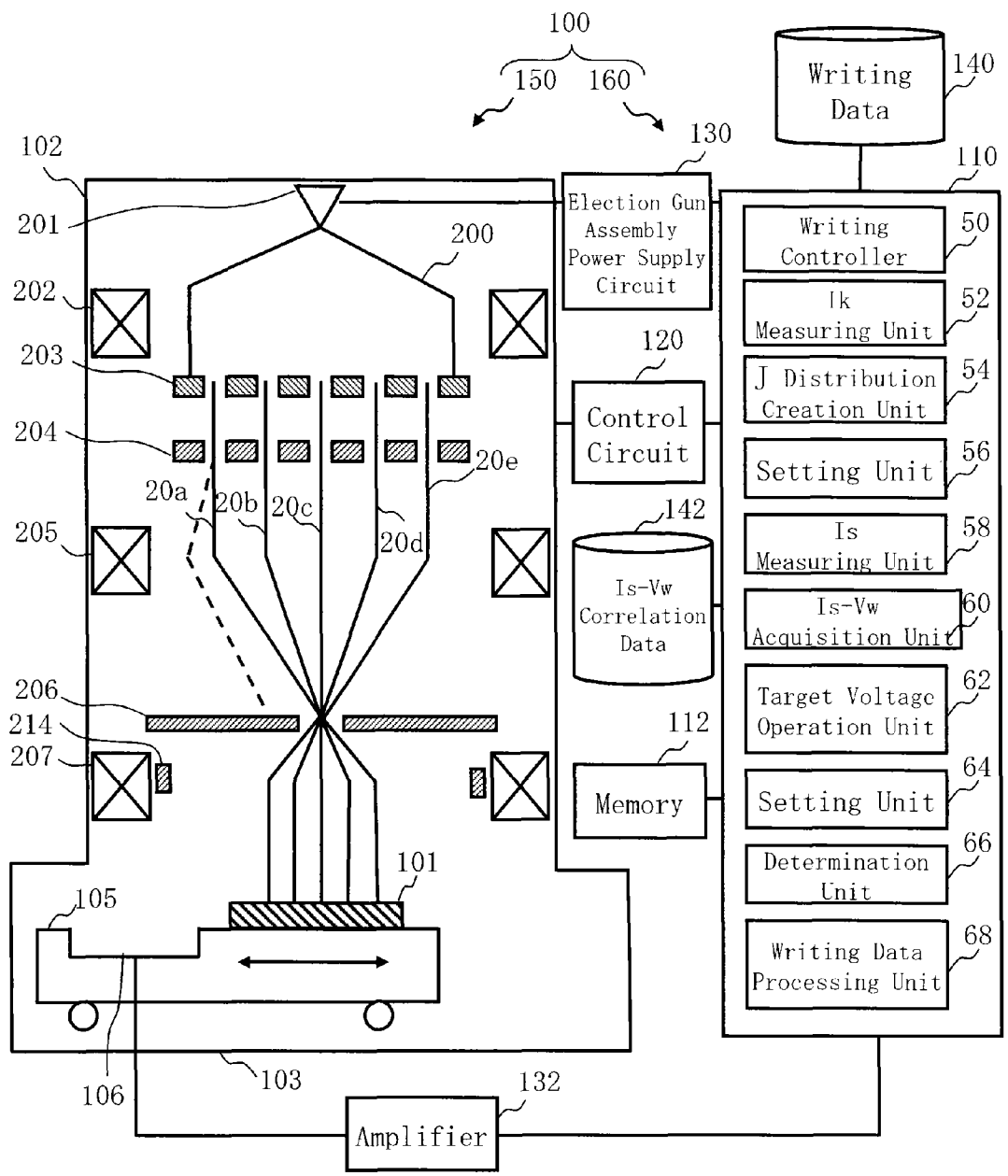
FIG. 1 is a conceptual diagram showing a configuration of a writing apparatus according to Embodiment 1.

FIG. 1 is a conceptual diagram showing a configuration of a writing apparatus according to Embodiment 1. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. An electron gun assembly 201, an illumination lens 202, an aperture plate member 203, a blanking plate 204, a reducing lens 205, a limiting aperture plate member 206, an objective lens 207, and a deflector 214 are arranged inside the electron optical column 102. An XY stage 105 is arranged inside the writing chamber 103. A target object 101 such as a mask to be a writing target substrate during writing is arranged on the XY stage 105. The target object 101 includes masks for exposure used when semiconductor devices are manufactured, and semiconductor substrates (silicon wafers) on which semiconductor devices are manufactured. The target object 101 also includes mask blanks coated with a resist without any writing. A Faraday cup is arranged on the XY stage 105 in a different position from a position where the target object 101 is arranged.

Further, the reducing lens 205 and the objective lens 207 are both configured by an electromagnetic lens and are arranged in such a way that magnetic fields are in opposite directions and the magnitudes of excitation are, for example, equal. The reducing lens 205 and the objective lens 207 constitute a reducing optics.

The control unit 160 includes a control computer 110, a memory 112, a control circuit 120, an electron gun assembly power supply circuit 130, an amplifier 132, and data storage apparatuses 140, 142 such as magnetic disk drives. The control computer 110, the memory 112, the control circuit 120, the electron gun assembly power supply circuit 130, the amplifier 132, and the data storage apparatuses 140, 142 are mutually connected via a bus (not shown).

A writing controller 50, an individual beam current (Ik) measuring unit 52, a current density (J) distribution creation unit 54, a setting unit 56, a reference region beam current (Is) measuring unit 58, a correlation data acquisition unit 60, a target voltage operation unit 62, a setting unit 64, a determination unit 66, and a writing data processing unit 68 are arranged inside the control computer 110. Each function such as the writing controller 50, the Ik measuring unit 52, the J distribution creation unit 54, the setting unit 56, the Is measuring unit 58, the correlation data acquisition unit 60, the target voltage operation unit 62, the setting unit 64, the determination unit 66, and the writing data processing unit 68 may be configured by software such as a program. Alternatively, such functions may be configured by hardware such as an electronic circuit or a combination of software and hardware. Input data needed in the control computer 110 or operation results are stored in the memory 112 each time. Further, if at least one of the writing controller 50, the Ik measuring unit 52, the J distribution creation unit 54, the setting unit 56, the Is measuring unit 58, the correlation data acquisition unit 60, the target voltage operation unit 62, the setting unit 64, the determination unit 66, and the writing data processing unit 68 is configured by software, a calculator such as a CPU and a GPU is arranged.

Here, FIG. 1 shows a configuration needed to describe Embodiment 1. Other configurations normally needed for the writing apparatus 100 may also be included.

Figure 2:
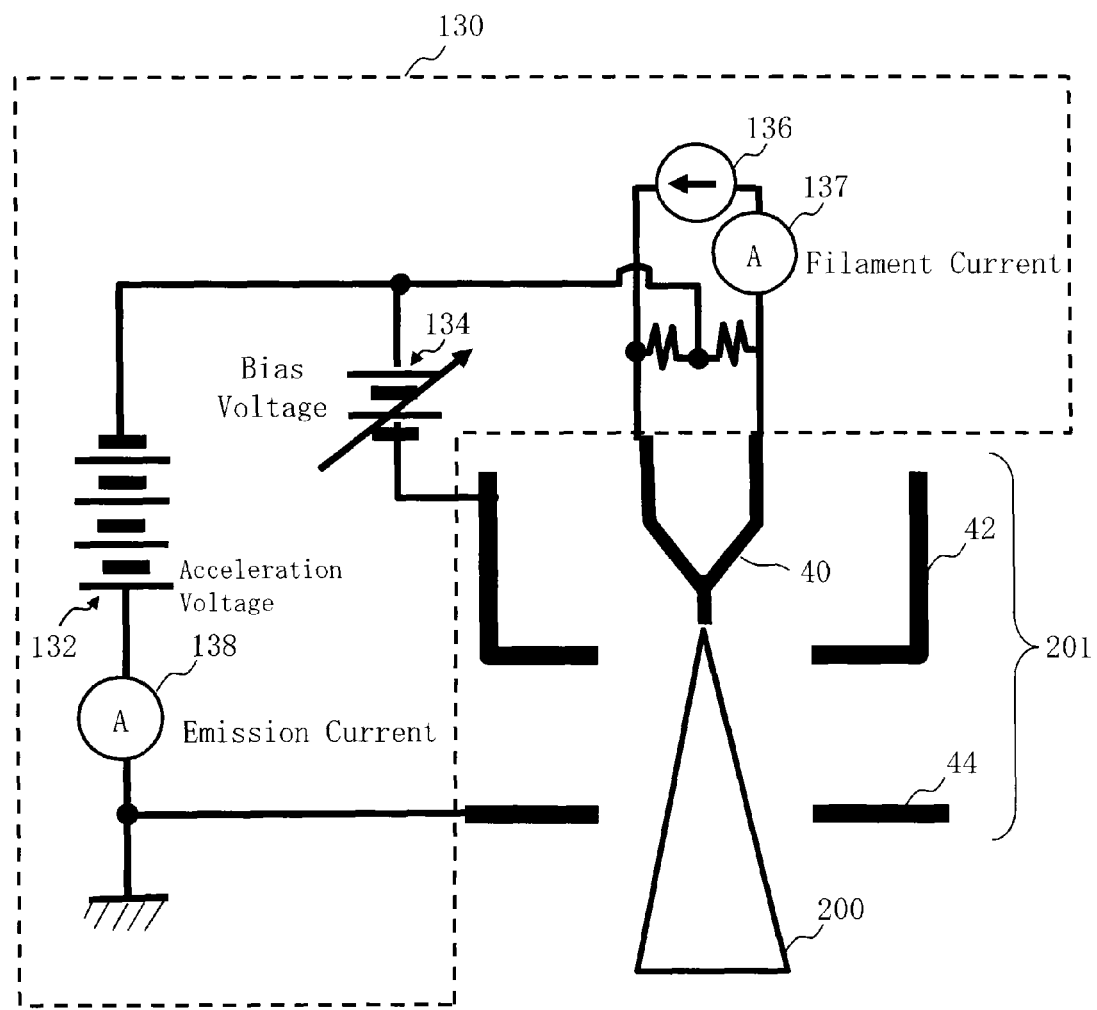
FIG. 2 is a diagram showing an internal configuration of an electron gun assembly and an electron gun assembly power supply circuit in Embodiment 1.

FIG. 2 is a diagram showing an internal configuration of an electron gun assembly and an electron gun assembly power supply circuit in Embodiment 1. In FIG. 2, the electron gun assembly 201 is a thermal-electron gun assembly (electron gun assembly of thermal emission type) and a cathode 40, Wehnelt 42 (Wehnelt electrode), and an anode 44 are arranged inside the electron gun assembly 201. As the cathode 40, for example, a lanthanum hexaboride ($LaB_6$) crystal can suitably be used. The Wehnelt 42 is arranged between the cathode 40 and the anode 44. Further, the anode 44 is grounded and the potential thereof is set to the ground potential. The electron gun assembly power supply circuit 130 is connected to the electron gun assembly 201.

In the electron gun assembly power supply circuit 130, an acceleration voltage power supply circuit 132, a bias voltage power supply circuit 134, a filament power supply circuit 136 (filament power supply unit), and current detectors 137, 138 are arranged. The cathode (−) side of the acceleration voltage power supply circuit 132 is connected to the cathode 40 inside the electron optical column 102. The anode (+) side of the acceleration voltage power supply circuit 132 is connected to the anode 44 inside the electron optical column 102 and is also grounded (ground connection). Further, the cathode (−) of the acceleration voltage power supply circuit 132 is also branched and connected to the anode (+) of the bias voltage power supply circuit 134. The cathode (−) of the bias voltage power supply circuit 134 is electrically connected to the Wehnelt 42. In other words, the bias voltage power supply circuit 134 is arranged between the cathode (−) of the acceleration voltage power supply circuit 132 and the Wehnelt 42 so as to be electrically connected. Further, a portion of the cathode 40 on the opposite side of the electron emission surface is covered with a heater member. Then, the filament power supply circuit 136 is connected to the heater member of the cathode 40. The acceleration voltage power supply circuit 132 applies an acceleration voltage between the cathode 40 and the anode 44. The bias voltage power supply circuit 134 applies a bias voltage to the Wehnelt 42. Then, the filament power supply circuit 136 supplies filament power to the cathode 40 via the heater member for heating. The current detector 137 is connected in series to circuits of the heater member of the cathode 40 and the filament power supply circuit 136. The current detector 138 is connected in series between the anode (+) side of the acceleration voltage power supply circuit 132 and the ground.

Figure 3A:
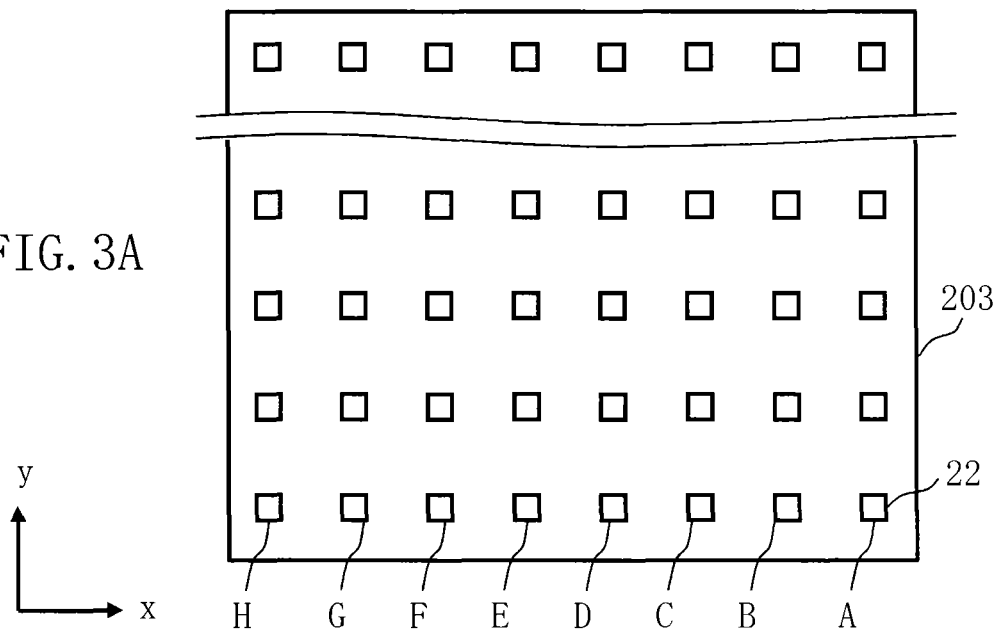
FIGS. 3A and 3B are conceptual diagrams showing a configuration of an aperture plate member in Embodiment 1.
Figure 3B:
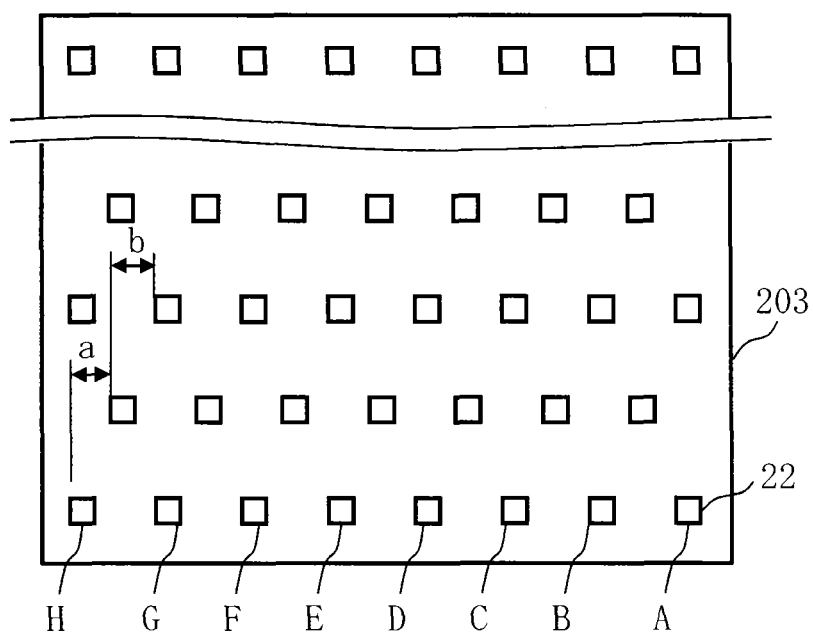

FIGS. 3A and 3B are conceptual diagrams showing a configuration of an aperture plate member in Embodiment 1. In FIG. 3A, the aperture plate member 203 has vertical m rows (y direction)×horizontal n rows (x direction) (m, n≥2) holes (openings) 22 formed therein in a matrix shape with predetermined arrangement pitches. In FIG. 3A, for example, the 518×8 holes 22 are formed. Each of the holes 22 is formed in a rectangular shape of the same dimensions and shape. Alternatively, the holes 22 have a circular shape of the same outside diameter. Here, an example in which the eight holes 22 of A to H are formed in the x direction for each row in the y direction is shown. Multiple beams 20 is formed by letting portions of an electron beam 200 respectively pass through a corresponding hole 22 of the plurality of holes 22. Here, an example in which the holes 22 are arranged in two rows or more in both the vertical and horizontal directions (x, y directions) is shown, but the arrangement is not limited to such an example. For example, in one of the vertical and horizontal directions (x, y directions) there may be a plurality of rows and in the other there may be a single row. Further, the way of arranging the holes 22 is not limited to a grid pattern arrangement in the vertical and horizontal directions as shown in FIG. 3A. For example, as shown in FIG. 3B, holes in the first row and the second row in the vertical direction (y direction) may be arranged by being shifted by a dimension a in the horizontal direction (x direction). Similarly, holes in the second row and the third row in the vertical direction (y direction) may be arranged by being shifted by a dimension b in the horizontal direction (x direction).

Figure 4:
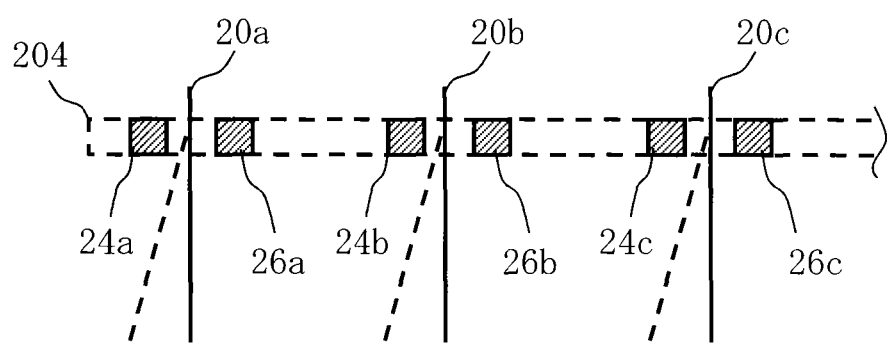
FIG. 4 is a conceptual diagram showing a configuration of a blanking plate in Embodiment 1.

FIG. 4 is a conceptual diagram showing a configuration of a blanking plate in Embodiment 1. The blanking plate 204 has through holes formed therein in conformity to the arrangement position of each of the holes 22 of the aperture plate member 203 and a set of two electrodes 24, 26 (blanker: first deflector) to be a pair is arranged in each through hole. The electron beam 20 passing through each through hole is deflected by voltages independently applied by the two electrodes 24, 26 to be a pair. Blanking control is exercised by such deflection. In this manner, a plurality of blankers performs blanking deflection of corresponding beams of multiple beams having passed through the plurality of holes 22 (openings) of the aperture plate member 203.

The electron beam 200 emitted from the electron gun assembly 201 (emission unit) illuminates the whole aperture plate member 203 approximately perpendicularly through the illumination lens 202. The aperture plate member 203 has a plurality of rectangular holes (openings) formed therein and the electron beam 200 illuminates a region where all of the plurality of holes is contained. A plurality of electron beams (multiple beams) 20a to 20e in, for example, a rectangular shape is formed by passing each portion of the electron beam 200 with which the position of the plurality of holes is irradiated through each of the plurality of holes of the aperture plate member 203. The multiple beams 20a to 20e passes through the respective corresponding blankers (first deflector) of the blanking plate 204. The blankers each deflect the electron beam 20 passing therethrough individually (perform blanking deflection). Then, the multiple beams 20a to 20e having passed through the blanking plate 204 is condensed after being refracted by the reducing lens 205 before traveling toward the center hole formed in the limiting aperture plate member 206. Here, the electron beam 20 deflected by the blanker of the blanking plate 204 deviates from the center hole of the limiting aperture plate member 206 (blanking aperture plate member) and is blocked by the limiting aperture plate member 206. On the other hand, the electron beam 20 not deflected by the blanker of the blanking plate 204 passes through the center hole of the limiting aperture plate member 206. The blanking control is exercised by such ON/OFF of the blanker and ON/OFF of a beam is controlled. Thus, the limiting aperture plate member 206 shields each beam deflected by a plurality of blankers so as to be in a state of beam OFF. Then, one shot of beam is formed by a beam formed between beam ON and beam OFF and having passed through the limiting aperture plate member 206. A pattern image of the multiple beams 20 having passed through the limiting aperture plate member 206 is focused by the objective lens 207 and deflected by the deflector 214 together before each irradiation position on the target object 101 is irradiated with the pattern image of the multiple beams 20.

The writing apparatus 100 performs a writing operation in the raster scan mode in which irradiation of shot beam is continuously performed one after another while the XY stage 105 moves, and when a desired pattern is written, a beam needed in accordance with the pattern is controlled to be in a beam ON state by blanking control.

Figure 5:
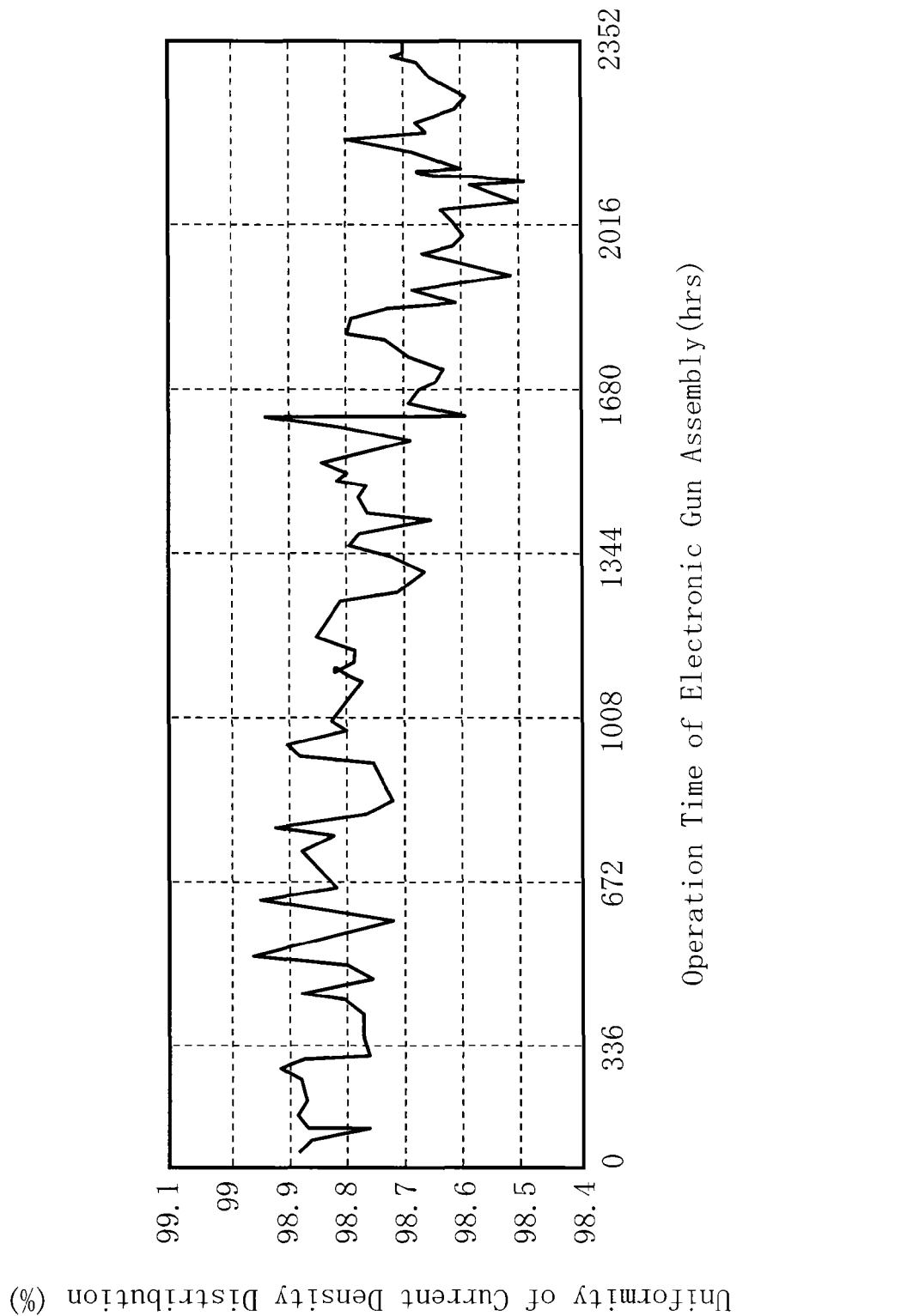
FIG. 5 is a graph showing an example of the relationship between uniformity of a current density distribution and an operation time of the electron gun assembly in Embodiment 1.

FIG. 5 is a graph showing an example of the relationship between uniformity of a current density distribution and an operation time of the electron gun assembly in Embodiment 1. Uniformity of the current density distribution on a mask surface was measured by using a writing apparatus of the variable-shaped single beam mode to measure a current in each of a plurality of measurement regions defined as regions of 30 μm per side distributed on the mask surface. More specifically, the whole beam having passed through a first shaping aperture plate is also caused to pass through a second shaping aperture plate and the stage is irradiated with such a first shaping aperture image. At this point, while the position of a Faraday cup having a detection area corresponding to 30 μm per side on the mask surface is moved to the position of each measurement region, the current detected by the Faraday cup in the position of each measurement region is measured. Accordingly, the current in each measurement region can be measured. In this case, the optical axis or the like was regulated such that the beam with which the measurement region in the center position of the mask surface is irradiated contains the peak of the current density distribution on the mask surface. Then, the Wehnelt voltage (bias voltage) was regulated at an interval of a few tens of minutes in order to maintain the current of the measurement region containing the peak of the current density distribution constant. As a result, as shown in FIG. 5, regarding uniformity of the current density distribution, experimental results of change of only about 0.3% for 2000 hours was obtained. From the above results, also in multiple beams writing, it has been found that uniformity of the current density distribution in the whole multiple beams can be maintained with high precision for a long time by regulating the Wehnelt voltage (bias voltage) at a predetermined interval in order to maintain the current of an individual beam containing the peak of the current density distribution constant.

Figure 6:
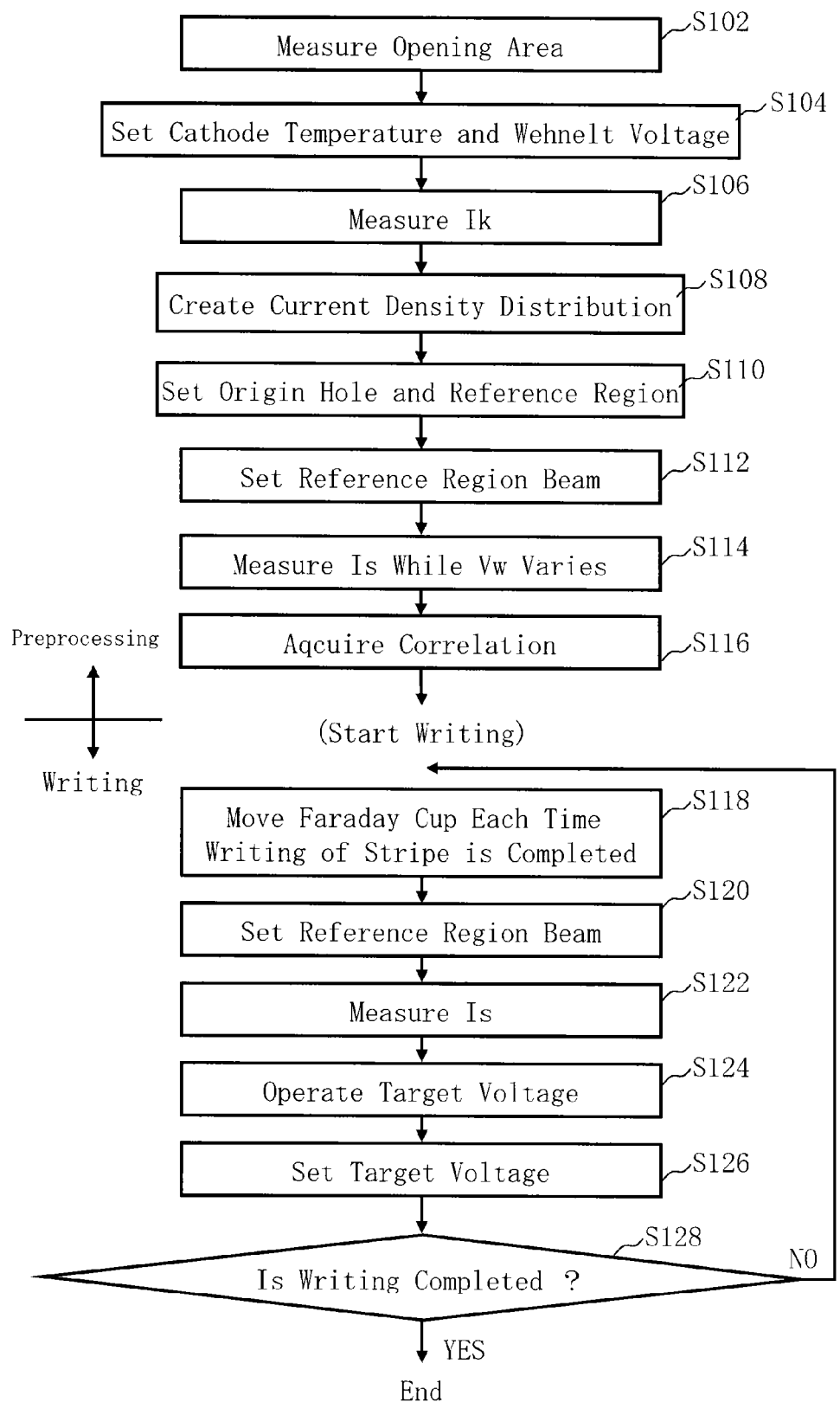
FIG. 6 is a flow chart illustrating principal processes of a current regulation method of multiple beams in Embodiment 1.

FIG. 6 is a flowchart illustrating principal processes of a current regulation method of multiple beams in Embodiment 1. In FIG. 6, the current regulation method of multiple beams in Embodiment 1 executes a series of processes including an opening area measuring process (S102), a cathode temperature and Wehnelt voltage setting process (S104), an individual beam current (Ik) measuring process (S106), a current density (J) distribution creation process (S108), an origin hole and reference region setting process (S110), a reference region beam setting process (S112), a reference region beam current (Is) measuring process (S114), a correlation data acquisition process (S116), after writing is started, a Faraday cup movement process (S118) for each stripe region, a reference region beam setting process (S120), a reference region beam current (Is) measuring process (S122), a target voltage operation process (S124), a target voltage setting process (S126), and a determination process (S128).

As the opening area measuring process (S102), an image of each of the holes 22 of the aperture plate member 203 is captured by using a scanning electron microscope (SEM) to calculate an opening area Sk of the opening which forms each beam of multiple beams from the captured images. Alternatively, each of the holes 22 of the aperture plate member 203 is irradiated with laser to calculate an opening area Sk of the opening which forms each beam by using the amount of transmitted light of laser for each of the holes 22. Hereinafter, k denotes the identification numbers or coordinates (vectors) of individual beams.

As the cathode temperature and Wehnelt voltage setting process (S104), the writing controller 50 sets the cathode temperature (filament power) at which the electron gun assembly 201 operates satisfactorily in the filament power supply circuit 136. The writing controller 50 also sets the Wehnelt voltage at which the electron gun assembly 201 operates satisfactorily in the bias voltage power supply circuit 134.

As the individual beam current (Ik) measuring process (S106), the Ik measuring unit 52 measures a current value ik of each beam of the multiple beams. A specific operation is as follows. Beams are deflected by the blankers in the blanking plate 204 such that only the beam to be measured is in a beam ON state and other beams are in a beam OFF state. Accordingly, only a target beam 20 can be guided onto the stage. At this point, the XY stage 105 is moved such that the Faraday cup 106 is irradiated with the target beam 20. Accordingly, the current value of the target beam 20 can be detected. The remaining beams are blocked by the limiting aperture plate member 206. Thus, the beams are blocked before reaching the writing chamber 103. Therefore, the beams reach neither the stage 105 nor the target object 101. Information measured by the Faraday cup 106 is converted into a digital signal by the amplifier 132 and output to the Ik measuring unit 52. Accordingly, the Ik measuring unit 52 can measure the current ik of the target beam. The above operation is performed for all beams. Accordingly, the beam current ik can be measured for each beam.

As the current density (J) distribution creation process (S108), the J distribution creation unit 54 operates a current density (J) of each beam by dividing each measured beam current ik by the opening area Sk of the corresponding hole 22 of the aperture plate member 203. Then, the J distribution creation unit 54 defines the operated current density (J) for each beam position (position of the hole 22 which formed a beam) to create a current density (J) distribution.

Figure 7:
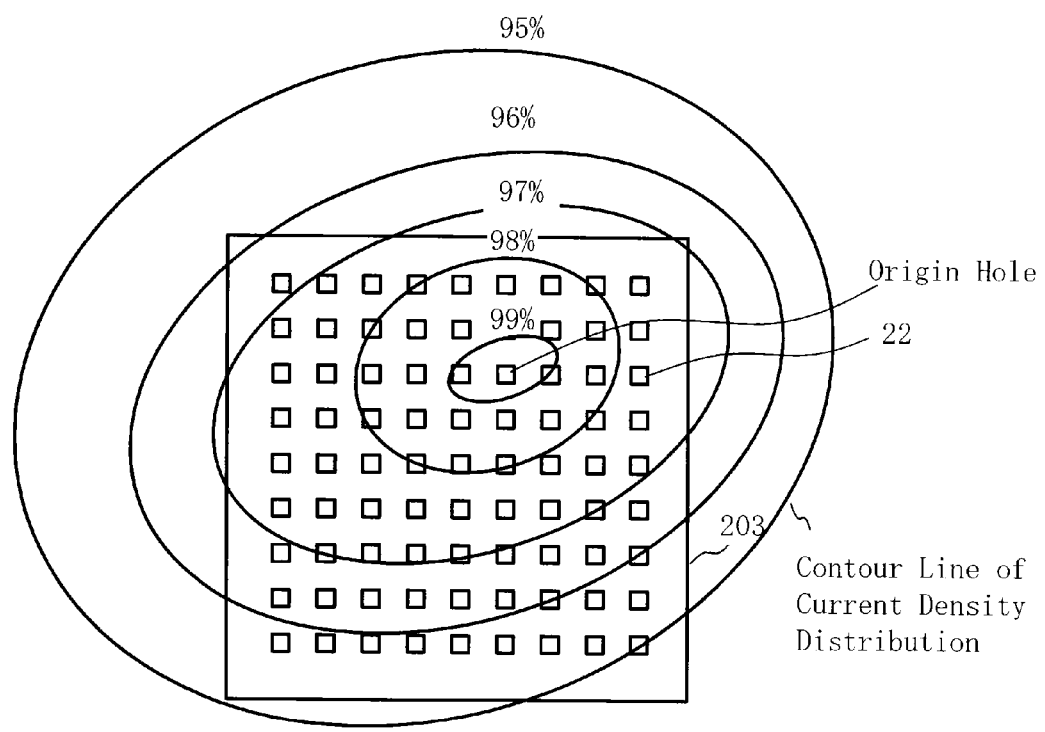
FIG. 7 is a diagram showing an example of a current density distribution of multiple beams in Embodiment 1.

FIG. 7 is a diagram showing an example of a current density distribution of multiple beams in Embodiment 1. As shown in FIG. 7, the current density distribution of the multiple beams is a radial distribution with reference to the peak position. Thus, in the current density distribution of the multiple beams, contour lines by the current density can be drawn by setting the maximum value of the current density to 100%.

In this manner, the current density distribution of the multiple beams formed by passing each portion of an electron beam emitted from the electron gun assembly 201 through each of the plurality of holes 22 of the aperture plate member 203 is acquired.

As the origin hole and reference region setting process (S110), the setting unit 56 sets the origin hole and a reference region by referring to the current density distribution.

Figure 8:
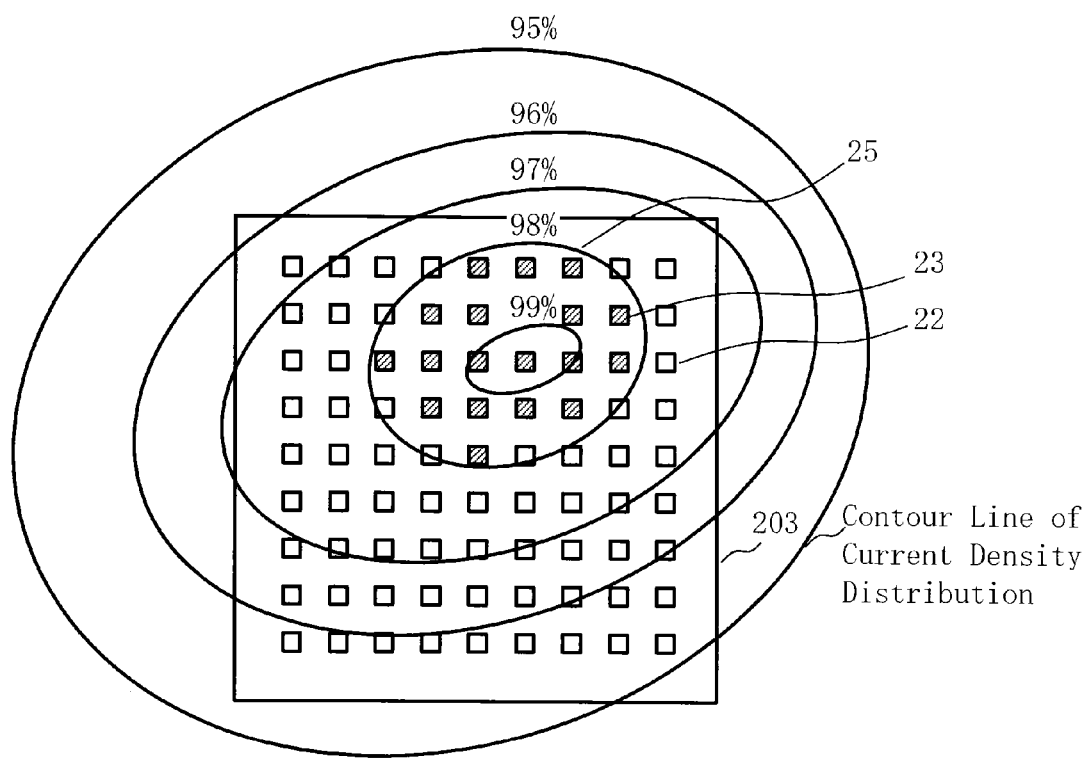
FIG. 8 is a diagram showing an example of a reference region in Embodiment 1.

FIG. 8 is a diagram showing an example of the reference region in Embodiment 1. The setting unit 56 first sets the beam forming hole 22 (origin hole) to be the maximum current density of the multiple beams by referring to the current density distribution. In the example of FIG. 8, the setting unit 56 sets one hole that is positioned in a region where the current density J is 99% and does not overlap with the contour line of 99% as the origin hole. Then, the setting unit 56 sets regions where the current density J is equal to or more than a threshold by referring to the current density distribution. In the example of FIG. 8, if the threshold is set to, for example, 99%, only the origin hole is selected. If the threshold is set to, for example, 98%, a plurality of holes 23 positioned within the contour line of 98% including the origin hole. The hole 22 that overlaps with a contour line even slightly is excluded. The setting unit 56 sets a region selected as described above as a reference region 25. The threshold may appropriately be set.

As the reference region beam setting process (S112), the setting unit 56 selects at least one beam whose current density J is equal to or more than a threshold from the multiple beams by referring to the current density distribution. More specifically, the setting unit 56 selects and sets a beam group (reference beam) formed by the plurality of holes 23 in the set reference region 25. In the example of FIG. 8, if the threshold is set to, for example, 99%, only the beam formed by the origin hole is selected as the reference beam. If the threshold is set to, for example, 98%, a beam group formed by the plurality of holes 22 positioned within the contour line of 98% including the origin hole is selected as the reference beam. In this manner, the setting unit 56 selects at least one beam (reference beam). With such settings, the writing controller 50 controls blankers in the blanking plate 204 via the control circuit 120 such that only the beam group (reference beam) in the reference region is in a beam ON state and other beams are in a beam OFF state. In addition, the XY stage 105 is moved so that the Faraday cup 106 is irradiated with the beam group (reference beam) in the reference region.

As the reference region beam current (Is) measuring process (S114), the Is measuring unit 58 measures the current value Is of the reference beam of the multiple beams. A more specific operation is as described below.

Figure 9:
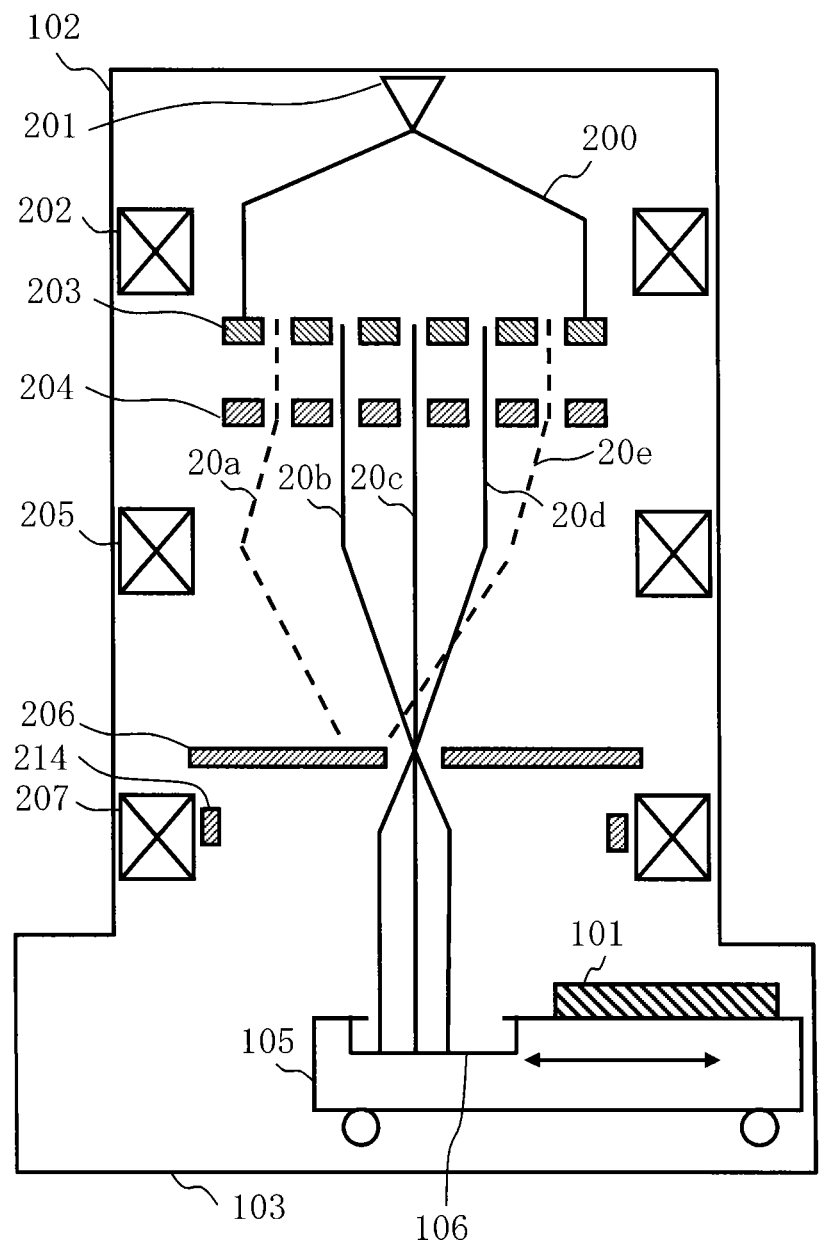
FIG. 9 is a conceptual diagram illustrating a technique of measuring a reference region beam current in Embodiment 1.

FIG. 9 is a conceptual diagram illustrating a technique of measuring the reference region beam current in Embodiment 1. Beams are deflected by blankers in the blanking plate 204 such that only reference beams 20$b$, 20$c$, 20$d$ are in a beam ON state and other beams 20$a$, 20$e$ are in a beam OFF state. Accordingly, only the reference beams 20$b$, 20$c$, 20$d$ can be guided onto the stage. Then, the Faraday cup 106 is irradiated with the reference beams 20$b$, 20$c$, 20$d$ and the current value of the whole reference beams 20$b$, 20$c$, 20$d$ is detected. The remaining beams 20$a$, 20$e$ are blocked by the limiting aperture plate member 206. Thus, the beams are blocked before reaching the writing chamber 103. Information measured by the Faraday cup 106 is converted into a digital signal by the amplifier 132 and output to the Is measuring unit 58. Accordingly, the Is measuring unit 58 can measure the current value Is of the whole reference beams 20$b$, 20$c$, 20$d$. If the reference beam is only one beam, for example, the reference beam 20$c$, it is needless to say that the Is measuring unit 58 measures the current value Is of only the beam 20$c$. Alternatively, if the reference beam is only one beam, for example, the reference beam 20$c$, measurement results of individual beams described above may be used.

As the correlation data acquisition process (S116), the Wehnelt voltage (bias voltage) applied to the Wehnelt electrode 42 of the electron gun assembly 201 is varied to measure the current value (reference current) of the reference beam, respectively.

Figure 10A:
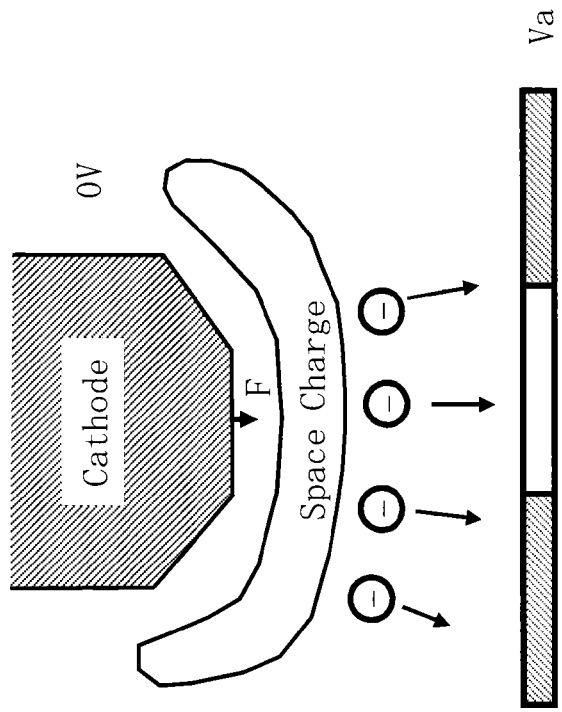
FIGS. 10A and 10B are conceptual diagrams illustrating a temperature limited region and a space charge limited region in Embodiment 1.
Figure 10B:
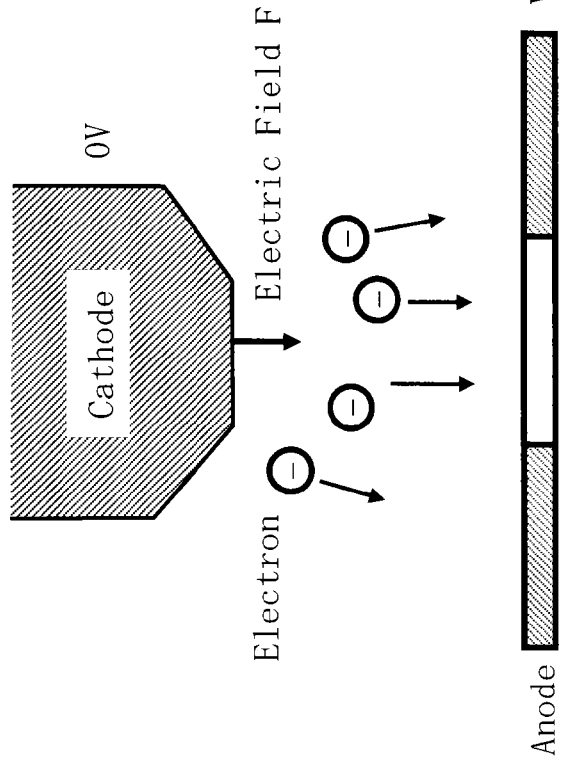

FIGS. 10A and 10B are conceptual diagrams illustrating a temperature limited region and a space charge limited region in Embodiment 1. The temperature limited region is shown in FIG. 10A. The space charge limited region is shown in FIG. 10B. In the temperature limited region shown in FIG. 10A, electrons emitted from the cathode travel in the direction of the anode. In this state, the number of emitted electrons largely depends on the cathode temperature. If the cathode temperature rises, by contrast, a transition to the space charge limited region shown in FIG. 10B occurs. In the space charge limited region, the number of electrons emitted increases due to a high temperature of the cathode. Thus, an electron cloud called a space charge is formed in front of the cathode. Then, since the space charge has a negative feedback effect on electron emission from the cathode, the number of emitted electrons no longer depends on the cathode temperature. Here, in Embodiment 1, the electron gun assembly 201 is operated in a space charge limited region that does not depend on the cathode temperature.

Figure 11:
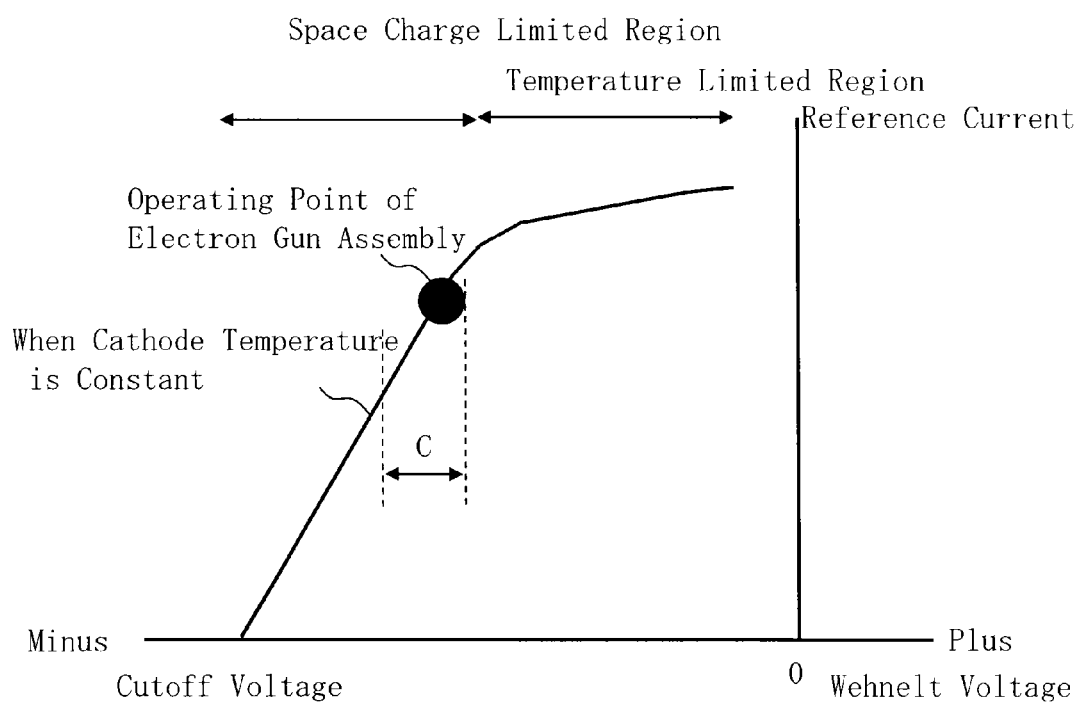
FIG. 11 is a diagram illustrating the relationship between a Wehnelt voltage and a reference current in Embodiment 1.

FIG. 11 is a diagram illustrating the relationship between the Wehnelt voltage and the reference current in Embodiment 1. As shown in FIG. 11, the reference current is substantially proportional to the Wehnelt voltage near an operating point of the electron gun assembly 201 in the space charge limited region. Since the writing apparatus 100 is operated near the operating point of the electron gun assembly 201 in such a space charge limited region, changes of the reference current at a peripheral voltage C containing points around the operating point of the electron gun assembly 201 may be measured in the correlation data acquisition process (S116).

Figure 12:
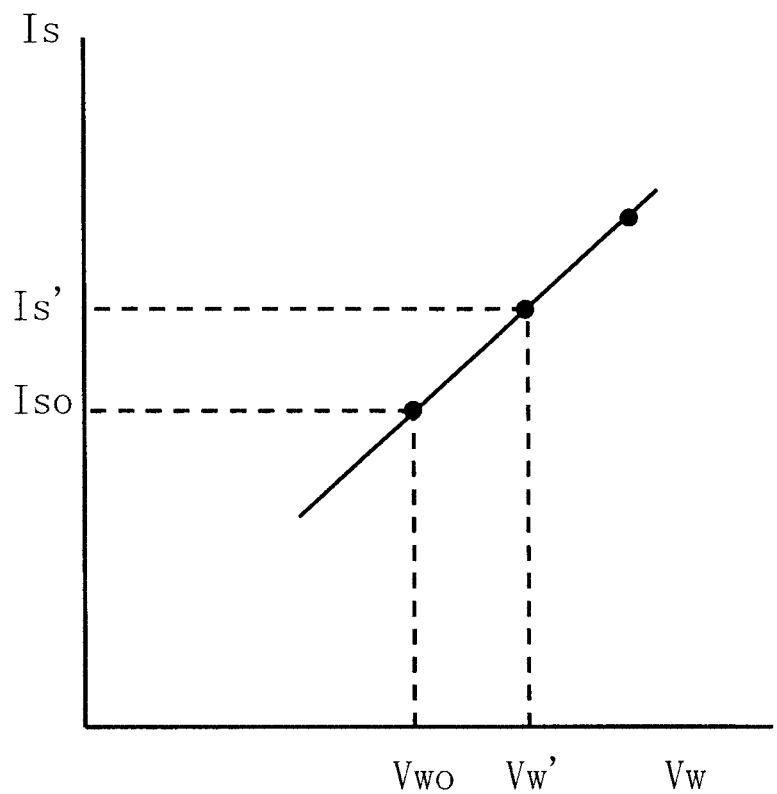
FIG. 12 is a diagram showing an example of the relationship between the Wehnelt voltage and the reference current in Embodiment 1.

FIG. 12 is a diagram showing an example of the relationship between the Wehnelt voltage and the reference current in Embodiment 1. In FIG. 12, the vertical axis represents a reference current Is. The horizontal axis represents a Wehnelt voltage Vw. As a result of measurement in the correlation data acquisition process (S116), as shown in FIG. 12, a substantially linear proportional relationship can be obtained. In this manner, the correlation data acquisition unit 60 acquires a correlation between the voltage applied to the Wehnelt electrode and the current value of the reference beam. Then, the correlation data is stored in the data storage apparatus 142. While the correlation is shown here as a graph, the correlation data acquisition unit 60 may also suitably determine a correlation formula by approximating plot data. In such a case, the correlation formula or coefficients of the correlation formula are stored in the data storage apparatus 142.

By executing each of the above processes, the relationship between the Wehnelt voltage and the reference current is acquired. Such a correlation is used hereinafter to regulate the current while actual writing is performed on the target object 101 which is a writing target. Therefore, after each of the above processes is executed, actual writing is started on the target object 101 which is a writing target.

As the writing process, the writing data processing unit 68 first reads writing data for each stripe region described later from the data storage apparatus 140 and performs a plurality of stages of data conversion processing to generate shot data specific to the apparatus. Then, the control circuit 120 controls the operation of each configuration of the writing unit 150 according to the shot data.

Figure 13A:
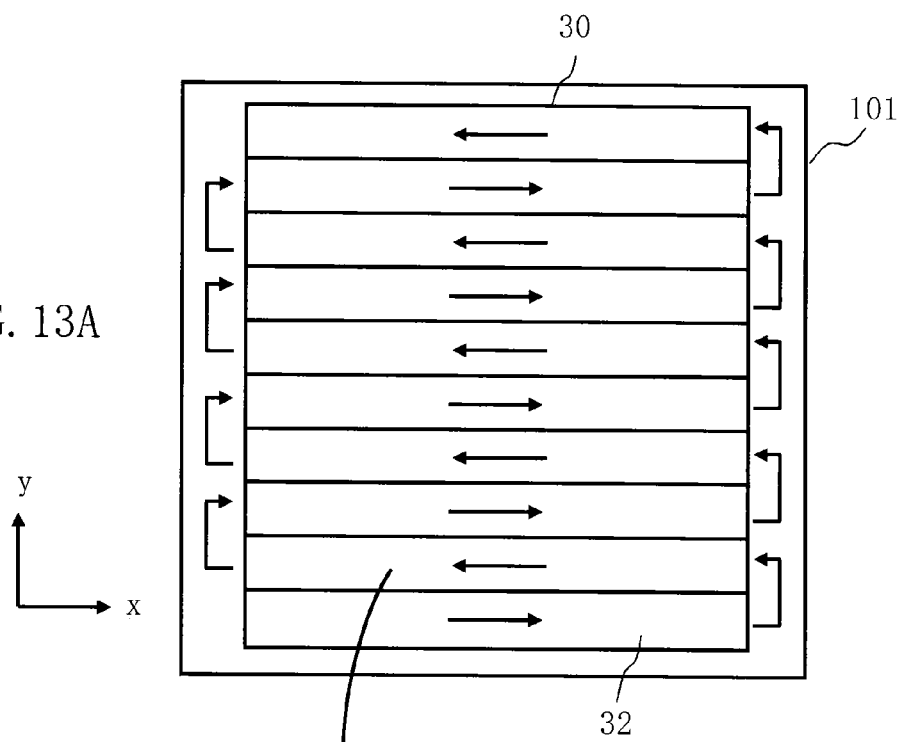
FIGS. 13A to 13C are conceptual diagrams illustrating a writing operation in Embodiment 1.
Figure 13B:
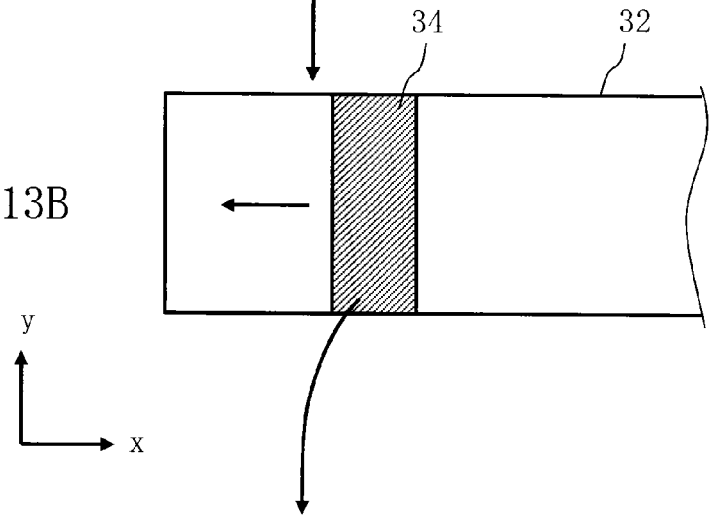
Figure 13C:
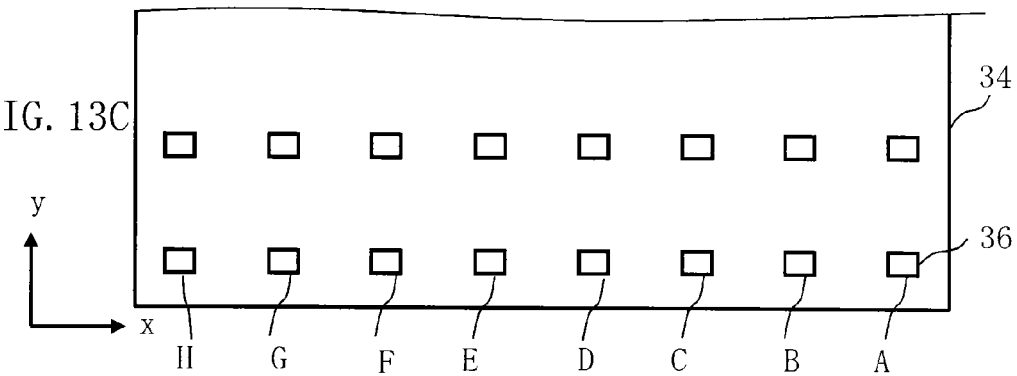

FIGS. 13A to 13C are conceptual diagrams illustrating the writing operation in Embodiment 1. As shown in FIG. 13A, a writing region 30 of the target object 101 is virtually divided into a plurality of stripe regions 32 in a thin rectangular shape having a predetermined width in, for example, the y direction. Each of the stripe regions 32 becomes a writing unit region. First, the XY stage 105 is moved to make adjustments so that an irradiation region 34 that can be irradiated with the multiple beams 20 at a time is positioned on the left end of the first stripe region 32 or at a position further to the left before writing is started. When writing of the first stripe region 32 is performed, by moving the XY stage 105 relatively in, for example, the −x direction, writing proceeds relatively in the x direction. The XY stage 105 is moved, for example, continuously at a predetermined speed. After the writing of the first stripe region 32 is completed, the stage position is moved in the −y direction to make adjustments so that the irradiation region 34 is positioned relatively in the y direction on the right end of the second stripe region 32 or at a position further to the right and in turn, as shown in FIG. 13B, by moving the XY stage 105 in, for example, the x direction, writing is similarly performed in the −x direction. The writing time can be reduced by alternately changing the direction of writing such as writing of the third stripe region 32 in the x direction and then writing of the fourth stripe region 32 in the −x direction. However, the writing operation is not limited to the case in which the direction of writing is alternately changed and when writing of each of the stripe regions 32 is performed, writing may proceed in the same direction. In one shot, as shown in FIG. 13C, a plurality of as many shot patterns 36 as the number of the holes 22 is formed at a time by multiple beams formed by a beam passing through each of the holes 22 of the aperture plate member 203. For example, a position of "A" shown in FIG. 13C is irradiated with a beam having passed through one hole A of the aperture plate member 203 to form a shot pattern 36 in the position. Similarly, a position of "B" shown in FIG. 13C is irradiated with a beam having passed through a hole B of the aperture plate member 203 to form the shot pattern 36 in the position. This also applies to C to H. Then, when writing of each of the stripe regions 32 is performed, writing is performed in the raster scan mode in which while the XY stage 105 moves in the x direction, all beams (multiple beams) are collectively deflected by at least one of electrostatic lenses 212, 214, 216 functioning also as a deflector to perform irradiation of shot beam continuously one after another.

Here, the writing apparatus 100 writes a pattern on the target object 101 by placing the target object 101 on the XY stage 105 and by continuously moving the XY stage 105 or performing a step and repeat operation thereof.

Figure 14A:
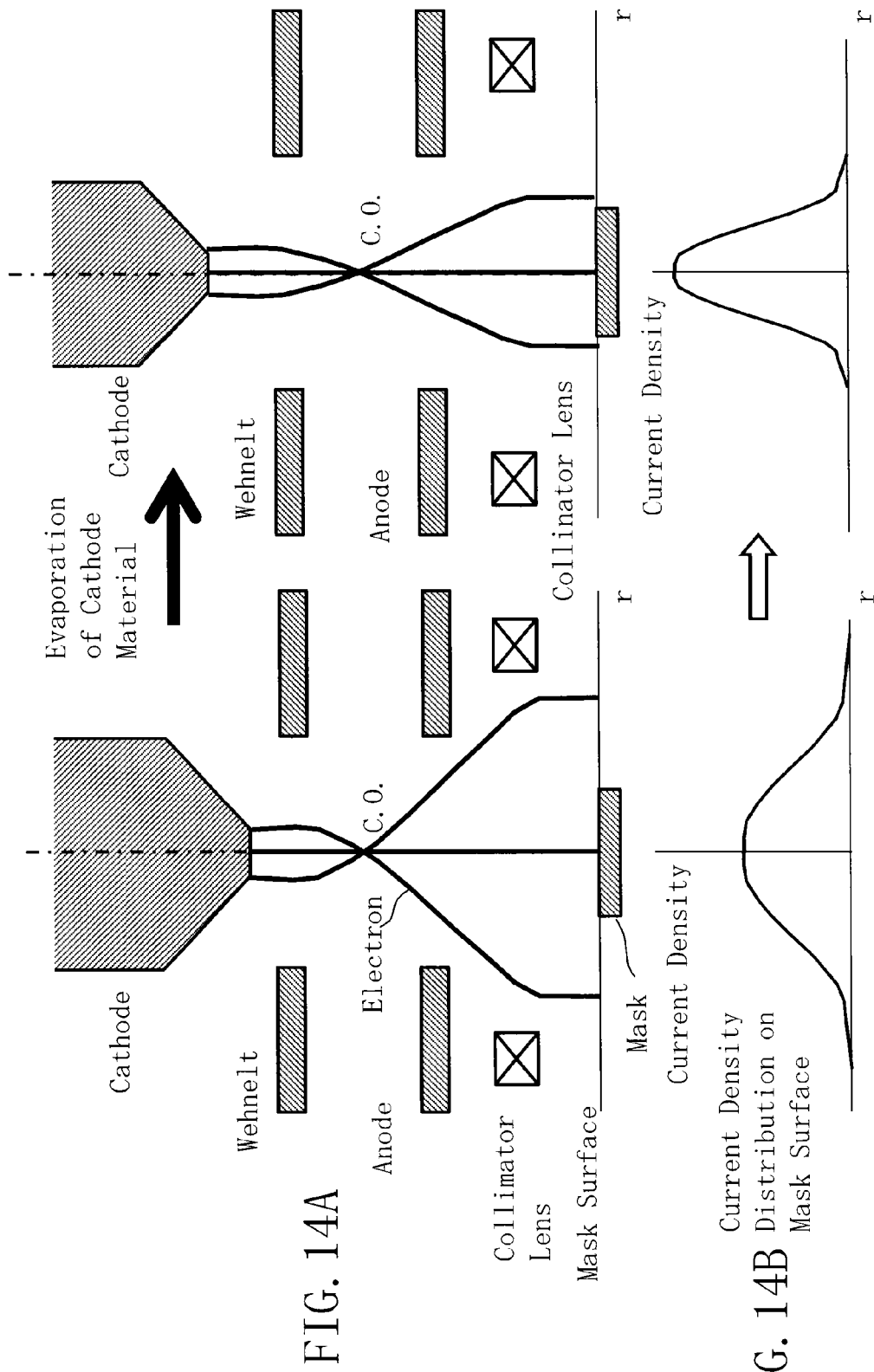

FIGS. 14A and 14B are diagrams illustrating changes of a current density distribution accompanying evaporation of a cathode in Comparative Example of Embodiment 1. Here, a case in which the technique in Embodiment 1 is not applied against cathode degradation is shown as Comparative Example of Embodiment 1. In FIG. 14A, before the cathode degradation, an electron beam emitted from the cathode spreads after forming a crossover and is refracted to an approximately vertical beam by an illumination lens (collimator lens) before traveling to the mask (target object) surface side. When the cathode evaporates (degrades) with the passage of time, the area of the emission surface of the cathode becomes smaller. However, the Wehnelt voltage does not change and so the current density increases. Thus, the spread of beam after crossover also becomes smaller. FIG. 14B shows the current density distribution in each state before and after the cathode degradation. If the cathode evaporates (degrades), when compared with the state before the cathode degradation, as described above, the spread of beam becomes smaller and the peak value of the current density distribution becomes higher. Therefore, the shape of the current density distribution considerably changes before and after the cathode degradation.

Figure 15:
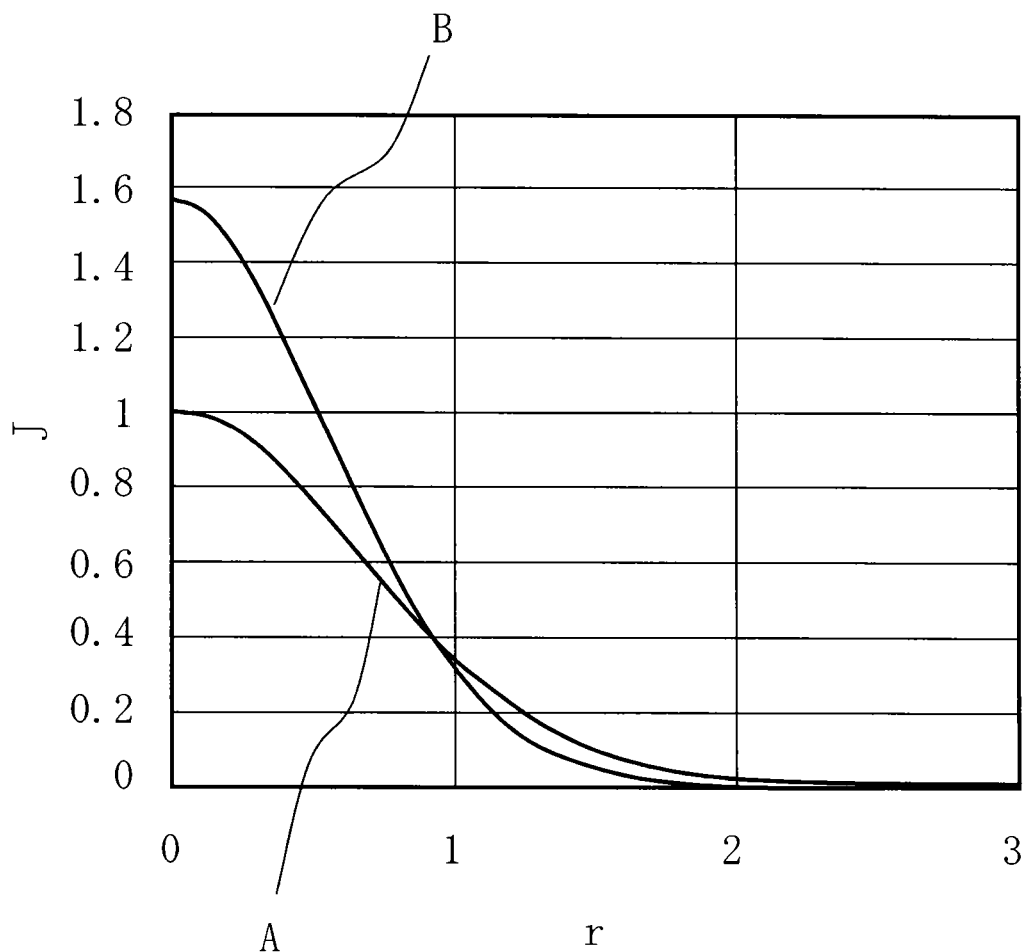
FIG. 15 is a diagram showing simulation results of current density distributions before and after evaporation of the cathode in Comparative Example of Embodiment 1.

FIG. 15 is a diagram showing simulation results of current density distributions before and after evaporation of the cathode in Comparative Example of Embodiment 1. Here, a case in which the technique in Embodiment 1 is not applied against cathode degradation is shown as Comparative Example of Embodiment 1. In FIG. 15, the vertical axis represents the current density J and the horizontal axis represents a position r. In a current density distribution B after the cathode degradation, as shown in FIG. 15, when compared with a current density distribution A before the cathode degradation, it is evident that the spread of distribution becomes smaller and the peak value of the current density distribution becomes higher.

Thus, in Embodiment 1, as described below, the peak value of the current density distribution is regulated not to become higher even after the degradation by periodically regulating the Wehnelt voltage of the reference beam. In Embodiment 1, for example, after writing is started, the Wehnelt voltage of the reference beam is regulated each time writing of the stripe region 32 is completed.

As the Faraday cup movement process (S118) for each stripe region, the writing controller 50 moves the XY stage 105 to a position where the reference beam (at least one beam in the reference region) can enter the Faraday cup 106 (current detector) arranged on the XY stage 105 each time writing of the stripe region 32 obtained by virtually dividing a writing region of the target object 101 in a thin rectangular shape is completed while a pattern is being written on the target object 101 arranged on the XY stage 105 via the control circuit 120.

As the reference region beam setting process (S120), the setting unit 56 selects at least one beam (reference beam) whose current density J is equal to or more than the threshold from the multiple beams by referring to the current density distribution. With such a setting, the writing controller 50 controls the blankers in the blanking plate 204 via the control circuit 120 such that only the beam group (reference beam) in the reference region is in a beam ON state and other beams are in a beam OFF state.

As the reference region beam current (Is) measuring process (S122), after moving the stage, the Is measuring unit 58 causes at least one beam (reference beam) whose current density J is equal to or more than the threshold of the multiple beams to enter the Faraday cup 106 while beams whose current density J is less than the threshold are blocked to measure the current value Is of the reference beam each time writing of the stripe region 32 is completed. The measuring technique may be the same as the technique described above.

As the target voltage operation process (S124), the target voltage operation unit 62 operates the target voltage value applied to the Wehnelt electrode to cause the measured reference current value Is to be a target current value $Is_0$ each time writing of the stripe region 32 is completed. For example, as shown in FIG. 12, a difference between a Wehnelt electrode Vw' corresponding to a measured reference current value Is' and a Wehnelt electrode $Vw_0$ corresponding to the target current value $Is_0$ is operated. Such a difference may be defined as a negative value when the Wehnelt electrode should be made smaller to cause the reference current value Is to be the target current value $Is_0$. Also, such a difference may be defined as a positive value when the Wehnelt electrode should be made larger to cause the reference current value Is to be the target current value $Is_0$. Then, the target voltage operation unit 62 operates using a value obtained by adding the obtained difference to the currently set Wehnelt electrode Vw as the target voltage.

As the target voltage setting process (S126), the setting unit 64 sets the target voltage value in the bias voltage power supply circuit 134. Then, the bias voltage power supply circuit 134 applies the target voltage value to the Wehnelt electrode 42.

Based on the foregoing, irradiation is performed with a beam of the target current value as the reference beam. Therefore, the current density in the reference region is maintained.

As the determination process (S128), the determination unit 66 determines whether writing processing is completed. If writing is not completed, each process from the Faraday cup movement process (S118) to the determination process (S128) is repeated for each stripe region after returning to the Faraday cup movement process (S118) for each stripe until writing processing is completed.

Figure 16:
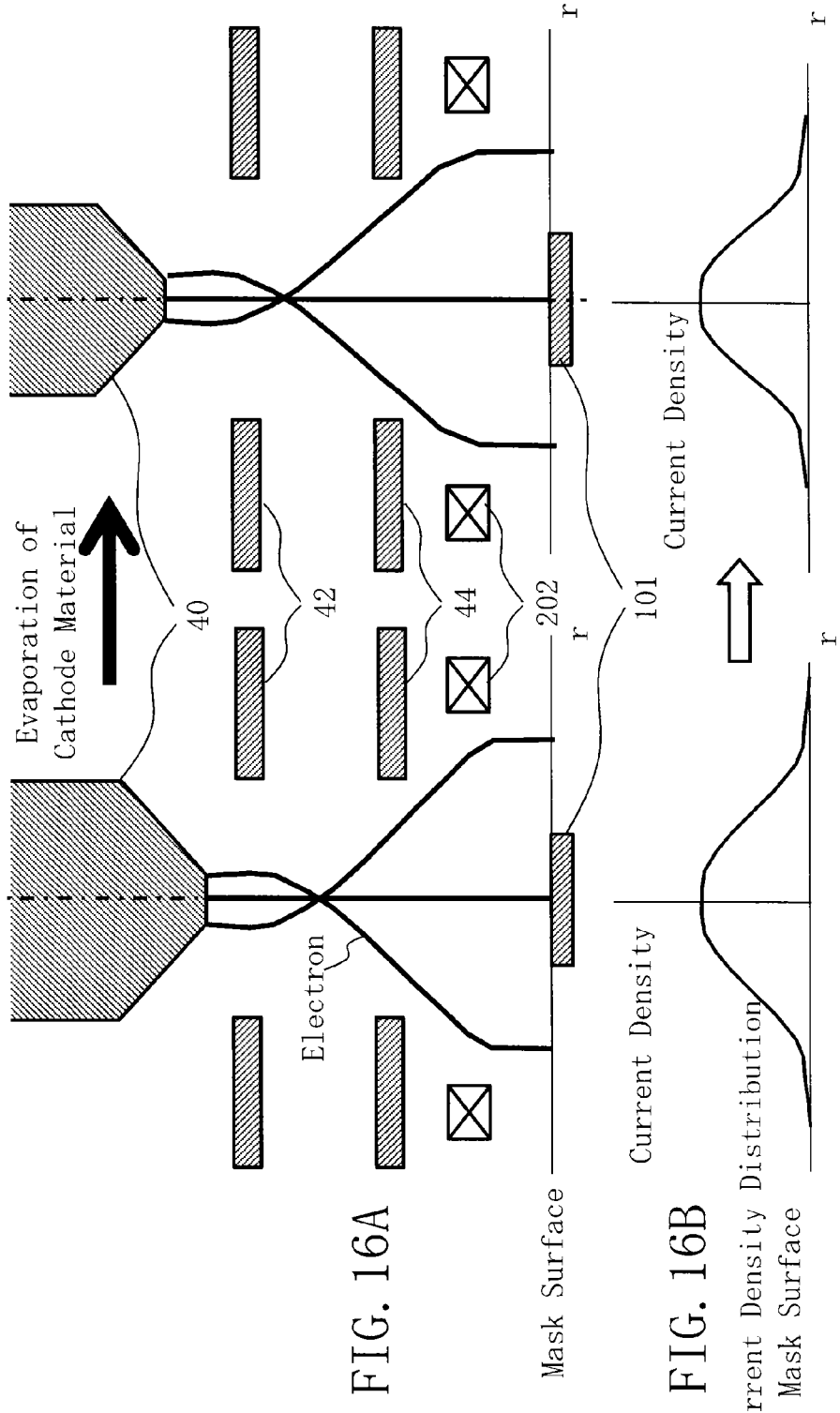
FIGS. 16A and 16B are diagrams illustrating changes of a current density distribution accompanying evaporation of a cathode in Embodiment 1.

FIGS. 16A and 16B are diagrams illustrating changes of a current density distribution accompanying evaporation of the cathode in Embodiment 1. In FIG. 16A, before the cathode degradation, similarly to the state shown in FIG. 14A, an electron beam emitted from the cathode spreads after forming a crossover and is refracted to an approximately vertical beam by the illumination lens 202 (collimator lens) before traveling to the mask (target object) surface side. When the cathode evaporates (degrades) with the passage of time, the area of the emission surface of the cathode becomes smaller. In Embodiment 1, however, the Wehnelt voltage is regulated and thus, the intensity of beam can be weakened to attain the intensity approximately same as the intensity before the cathode degradation. As a result, a crossover can be formed in a higher position than before the cathode degradation. Thus, the spread of beam after the crossover can be made wider than in Comparative Example and can be made approximately as wide as before the cathode degradation. In other words, an increase in current density can be suppressed. Thus, the spread of beam after the crossover can also be made approximately as wide as before the cathode degradation. Then, the electron beam spread approximately as wide as before the cathode degradation is refracted to an approximately vertical beam by the illumination lens 202 (collimator lens) before traveling to the mask (target object) surface side. FIG. 16B shows a current density distribution in each state before and after the cathode degradation. In Embodiment 1, when compared with the state before the cathode degradation, the spread of beam can also be maintained the same as before the degradation and the increase of the peak value of the current density distribution can be suppressed even if the cathode evaporates (degrades). In Embodiment 1, therefore, the substantially same shape of the current density distribution can be maintained before and after the cathode degradation.

Figure 17:
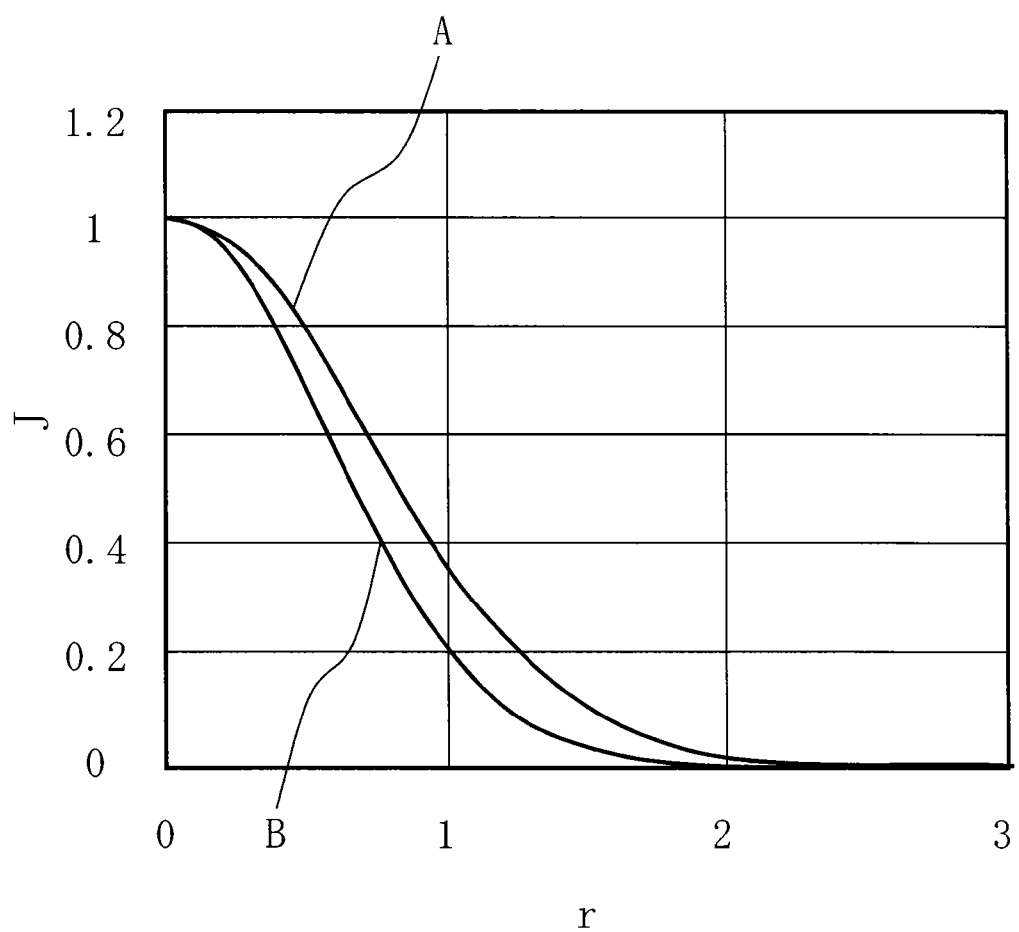
FIG. 17 is a diagram showing simulation results of current density distributions before and after evaporation of the cathode in Embodiment 1.

FIG. 17 is a diagram showing simulation results of current density distributions before and after evaporation of the cathode in Embodiment 1. In FIG. 17, the vertical axis represents the current density J and the horizontal axis represents the position r. In a current density distribution B after the cathode degradation, as shown in FIG. 17, when compared with a current density distribution A before the cathode degradation, it is evident that the difference of spreads of the distributions is smaller than in Comparative Example and the peak value of the current density distribution does not change.

Here, in the above examples, the current is regulated for each of the stripe regions 32 even while a pattern is being written on the target object 101, but the embodiment is not limited to such an example. The current value of the reference beam may be measured each time a predetermined time passes while a pattern is being written on the target object 101. A case in which, for example, 24 hours or more are needed for writing on one target object (for example, a mask) is on the increase. The results of change of 1% of the current density J for 24 hours was obtained when the electron gun assembly 201 was used by setting the temperature of the cathode 40 to, for example, 1800 K and the Wehnelt voltage to −500 V (value of the acceleration voltage before addition). If the allowable value of error of the current density J is, for example, 0.1%, current regulation may be carried out 10 times or so during 24 hours. Thus, current regulation is suitably carried out every 2.4 hours or at a predetermined interval of less than 2.4 hours. The interval of the current regulation may appropriately be set in accordance with an error of the current density J and the allowable value of error. Note that since the number of stripe regions is far larger than 10, it is possible to avoid a case in which an error of the current density J exceeds the above allowable value of error.

Figure 18A:
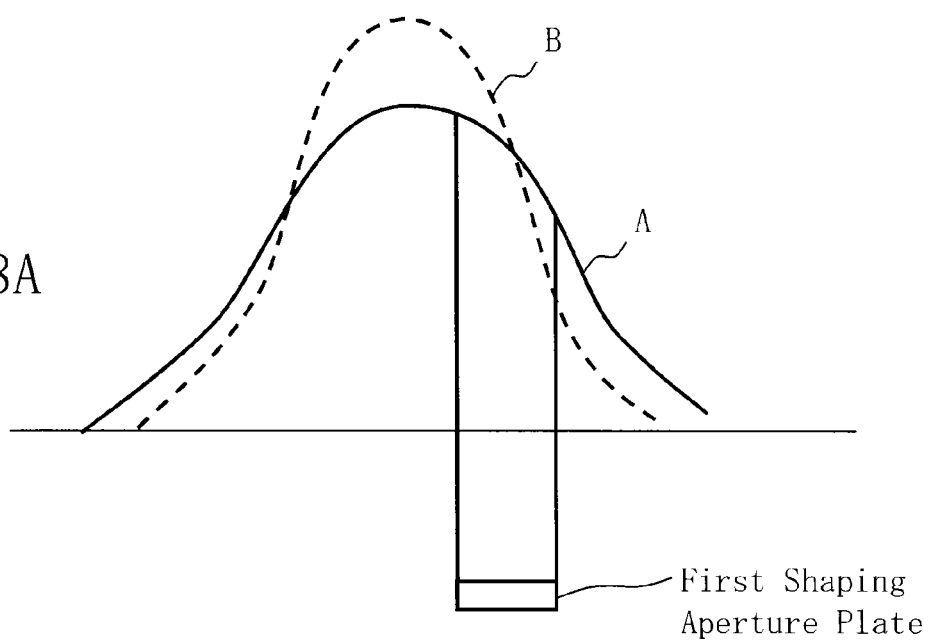
FIGS. 18A and 18B are diagrams illustrating differences of current regulation between multiple beams and a single beam in Embodiment 1.
Figure 18B:
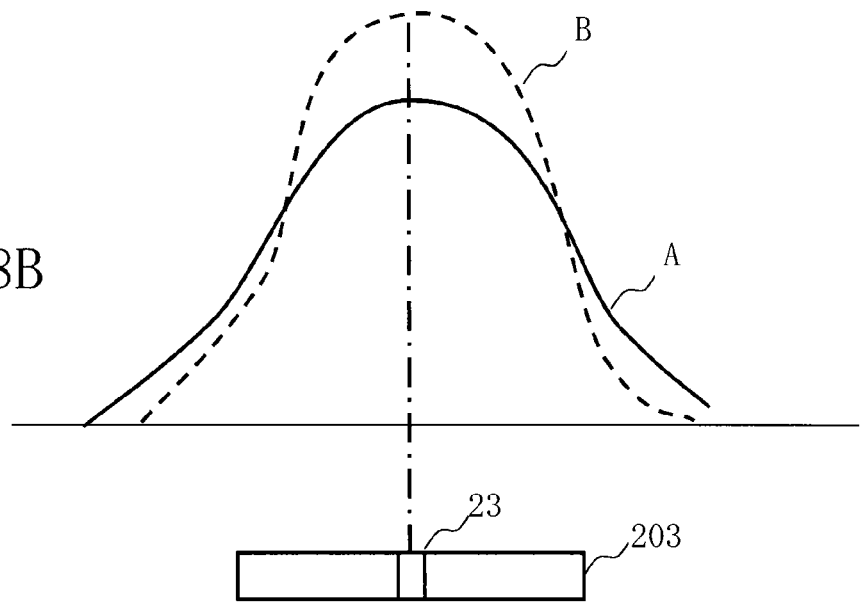

FIGS. 18A and 18B are diagrams illustrating differences of current regulation between multiple beams and a single beam in Embodiment 1. For example, in variable-shaped single beam writing, a beam having passed through the first shaping aperture plate is used for writing. Thus, it suffices that the amount of current (integral value of the amount of current) is maintained for the single beam having passed through the first shaping aperture plate. Thus, even if, as shown in FIG. 18A, the peak of the current density distribution of an electron beam emitted from the electron gun assembly 201 is not contained in the single beam having passed through the first shaping aperture plate, it suffices that the amount of current is maintained for the single beam. In a single beam, therefore, even if the current density distribution A before the cathode degradation changes to the current density distribution B after the cathode degradation and the peak value changes, the influence thereof is small. In other words, when a single beam is used, it does not matter whether the peak of the current density distribution is contained in the beam to be used. Therefore, it is enough to simply maintain the amount of current of the measured beam. In multiple beams, by contrast, many beams are formed and the width of beams to be used is wide. Thus, as shown in FIG. 18B, the peak of the current density distribution of an electron beam is contained in a beam passing through any of the holes 22 of the aperture plate member 203. Therefore, in multiple beams, if the current density distribution A before the cathode degradation changes to the current density distribution B after the cathode degradation and the peak value changes, the influence thereof is large. Consequently, current regulation of multiple beams becomes difficult with the way of regulating a single beam which ignores the peak value of the current density distribution. In Embodiment 1, therefore, problems specific to multiple beams can be solved by regulating the current such that the amount of current of the reference beam containing the peak value of the current density distribution is maintained.

According to Embodiment 1, as described above, changes of the current density distribution accompanying the passage of time when multiple beams writing is performed can be suppressed. Therefore, degradation of pattern dimensions accompanying the passage of time when writing is performed can be suppressed.

Embodiment 2

In Embodiment 1, a case in which a portion of beams of multiple beams, at least one beam of multiple beams, is made as a reference beam is described. However, the embodiment is not limited to such a case. In Embodiment 2, a case in which all beams of multiple beams are made as reference beams will be described. A configuration of a writing apparatus 100 is the same as in FIG. 1 excluding portions described below. Principal processes of a current regulation method of multiple beams in Embodiment 2 are the same as in FIG. 6. If not specifically described, the content is the same as in Embodiment 1.

Figure 19:
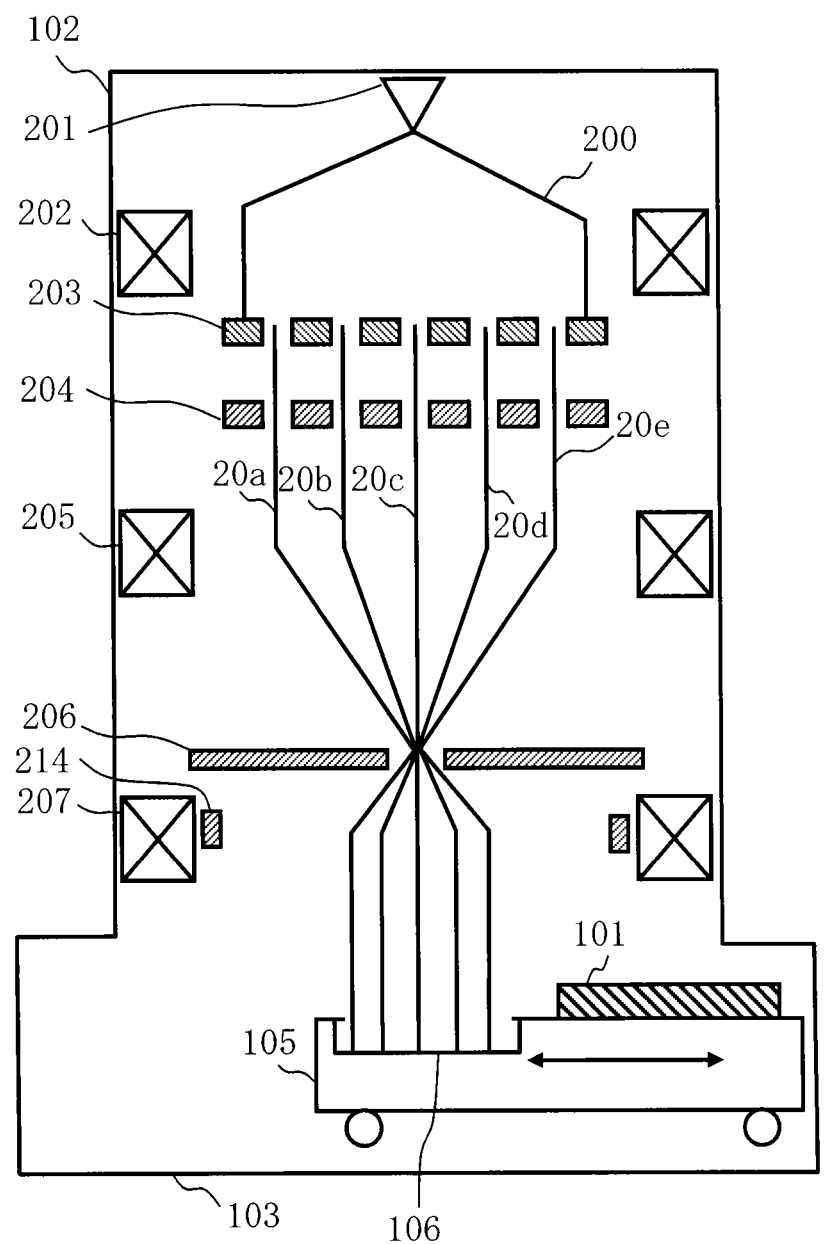
FIG. 19 is a conceptual diagram illustrating another example of a technique of measuring a reference region beam current in Embodiment 2.

FIG. 19 is a conceptual diagram illustrating another example of a technique of measuring a reference region beam current in Embodiment 2. Here, a case in which a threshold of a current density is relaxed to make all beams of multiple beams as reference beams will be described. In such a case, it is necessary to measure all current values of all beams of multiple beams. Thus, a Faraday cup having an incident surface of a size capable of detecting all beams is needed. In other words, if a Faraday cup 106 having an incident surface of a size capable of detecting all beams is included, all beams of multiple beams can be made as reference beams. In such a case, beams are deflected by blankers in a blanking plate 204 such that reference beams 20a, 20b, 20c, 20d, 20e are in a beam ON state. Then, the Faraday cup 106 is irradiated with the reference beams 20a, 20b, 20c, 20d, 20e and the current value of the whole reference beams 20a, 20b, 20c, 20d, 20e is detected. Information measured by the Faraday cup 106 is converted into a digital signal by an amplifier 132 and output to an Is measuring unit 58. Accordingly, the Is measuring unit 58 can measure a current value Is of the whole reference beams 20a, 20b, 20c, 20d, 20e.

Embodiment 3

In Embodiments 1 and 2, the configuration in which the one Faraday cup 106 is arranged on the XY stage 105 is described. However, the embodiment is not limited to such a case. In Embodiment 3, a case in which a plurality of Faraday cups 106 is arranged on an XY stage 105 will be described. A configuration of a writing apparatus 100 is the same as in FIG. 1 excluding portions described below. Principal processes of a current regulation method of multiple beams in Embodiment 3 are the same as in FIG. 6. If not specifically described, the content is the same as in Embodiment 1.

Figure 20:
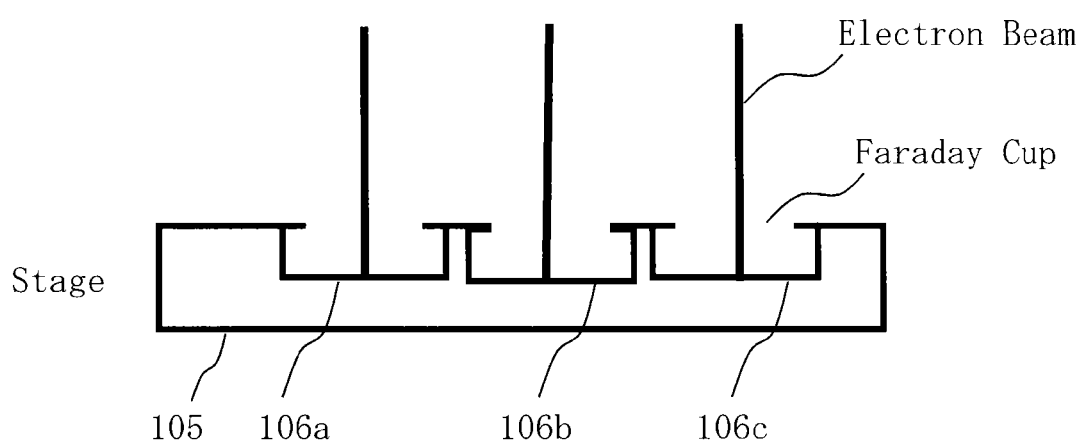
FIG. 20 is a conceptual diagram illustrating another example of a technique of measuring individual beam currents in Embodiment 3.

FIG. 20 is a conceptual diagram illustrating another example of a technique of measuring individual beam currents in Embodiment 3. In Embodiment 3, a plurality of Faraday cups 106a, 106b, 106c is arranged on the XY stage 105. Accordingly, in an individual beam current (Ik) measuring process (S106), an Ik measuring unit 52 can measure current values ik of a plurality of individual beams at the same time. A more specific operation is as described below. Beams are deflected by blankers in a blanking plate 204 such that only a plurality of beams to be measured is in a beam ON state and other beams are in a beam OFF state. Accordingly, only the plurality of beams to be measured can be guided onto the stage. In this case, the XY stage 105 is moved such that each of the plurality of Faraday cups 106a, 106b, 106c is irradiated with the one beam 20. Accordingly, the current values ik of the plurality of individual beams can be detected at the same time. The remaining beams are blocked by a limiting aperture plate member 206. Thus, the beams are blocked before reaching a writing chamber 103. Since the number of beams is large, it takes time to measure individual beam currents. According to Embodiment 3, by contrast, the current values ik of the plurality of individual beams can be detected at the same time and therefore, the measuring time can significantly be reduced. Three beams are detected at the same time in the example of FIG. 20, but the number of beams is not limited to three. The number of beams may be two or four or more. As many the Faraday cups 106 as the number of beams detected at the same time or more may be arranged on the XY stage 105.

In the foregoing, the embodiments have been described with reference to specific examples. However, the present invention is not limited to such specific examples. The raster scan operation described above is only an example and a raster scan operation using multiple beams or other operation methods may be applied.

Further, parts of the apparatus configuration, the control technique, and the like which are not needed to be explained directly for the explanation of the present invention are not described. However, a necessary apparatus configuration and a necessary control technique can be appropriately selected and used. For example, the configuration of a control unit that controls the writing apparatus 100 is not described, but it is needless to say that a necessary control unit configuration is appropriately selected and used.

In addition, all charged particle beam writing methods and charged particle beam writing apparatuses including the elements of the present invention and whose design can appropriately be altered by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A current regulation method of multiple beams comprising:
    acquiring a current density distribution of multiple beams formed by letting portions of an electron beam emitted from a thermal-electron gun assembly having a Wehnelt electrode respectively pass through a corresponding opening of a plurality of openings;
    selecting at least one beam whose current density is equal to or more than a threshold from the multiple beams used for writing a pattern on a target object by referring to the current density distribution;
    measuring a current value of the at least one beam whose current density is equal to or more than the threshold respectively by varying a voltage applied to the Wehnelt electrode of the thermal-electron gun assembly and acquiring a correlation between the voltage applied to the Wehnelt electrode and the current value of the at least one beam selected from the multiple beams used for writing the pattern on the target object;
    moving a stage to a position where the at least one beam is allowed to enter a current detector arranged on the stage each time writing of a stripe region obtained by virtually dividing a writing region of the target object in a thin rectangular shape is completed while the pattern is being written on the target object arranged on the stage;
    measuring, after moving the stage, a current value of the at least one beam each time the writing of the stripe region is completed by allowing the at least one beam to enter the current detector while beams of the multiple beams whose current density is less than the threshold are blocked;
    operating a target voltage value applied to the Wehnelt electrode to cause the current value measured to be a target current value by using the correlation; and
    applying the target voltage value to the Wehnelt electrode.

2. The method according to claim 1, further comprising:
    capturing images of the plurality of openings by using a scanning electron microscope (SEM); and
    calculating an opening area of a corresponding opening of the plurality of openings forming each beam of the multiple beams respectively from the images captured.

3. The method according to claim 1, further comprising:
    irradiating the plurality of openings with laser; and
    calculating an opening area of a corresponding opening forming each beam by using an amount of transmitted light of the laser for each of the plurality of openings.

4. The method according to claim 2, further comprising:
    setting, after the opening area of the corresponding opening forming each beam is respectively calculated, a cathode temperature at which the thermal-electron gun assembly operates satisfactorily in a filament power supply circuit.

5. The method according to claim 3, further comprising:
setting, after the opening area of the corresponding opening forming each beam is respectively calculated, a cathode temperature at which the thermal-electron gun assembly operates satisfactorily in the filament power supply circuit.

6. The method according to claim 2, further comprising:
measuring, after the opening area of the corresponding opening forming each beam is respectively calculated, a current value of each beam of the multiple beams.

7. The method according to claim 3, further comprising:
measuring, after the opening area of the corresponding opening forming each beam is respectively calculated, a current value of each beam of the multiple beams.

8. A current regulation method of multiple beams comprising:
acquiring a current density distribution of the multiple beams formed by letting portions of an electron beam emitted from a thermal-electron gun assembly having a Wehnelt electrode respectively pass through a corresponding opening of a plurality of openings;
selecting at least one beam whose current density is equal to or more than a threshold from the multiple beams used for writing a pattern on a target object by referring to the current density distribution;
measuring a current value of the at least one beam whose current density is equal to or more than a threshold while beams of the multiple beams whose current density is less than the threshold are blocked;
operating a target voltage value applied to the Wehnelt electrode to cause the current value measured to be a target current value by using a correlation between a voltage applied to the Wehnelt electrode of the thermal-electron gun assembly and the current value of the at least one beam selected from the multiple beams used for writing the pattern on the target object; and
applying the target voltage value to the Wehnelt electrode.

9. The method according to claim 8, wherein the current value of the at least one beam is measured each time writing of a stripe region obtained by virtually dividing a writing region of a target object in a thin rectangular shape is completed while a pattern is being written on the target object.

10. The method according to claim 8, wherein the current value of the at least one beam is measured each time a predetermined time passes while a pattern is being written on the target object.

11. The method according to claim 8, further comprising:
measuring the current value of the at least one beam by varying the voltage applied to the Wehnelt electrode of the thermal-electron gun assembly and acquiring the correlation.

12. The method according to claim 8, further comprising:
capturing images of the plurality of openings by using a scanning electron microscope (SEM); and
calculating an opening area of the corresponding opening of the plurality of openings forming each beam of the multiple beams respectively from the images captured.

13. The method according to claim 8, further comprising:
irradiating the plurality of openings with laser; and
calculating an opening area of the corresponding opening forming each beam by using an amount of transmitted light of the laser for each of the plurality of openings.

* * * * *